United States Patent [19]
Fujii

[11] Patent Number: 5,627,399
[45] Date of Patent: May 6, 1997

[54] SEMICONDUCTOR DEVICE

[75] Inventor: Tetsuo Fujii, Toyohashi, Japan

[73] Assignee: Nippondenso Co., Ltd., Kariya, Japan

[21] Appl. No.: 565,052

[22] Filed: Nov. 28, 1995

Related U.S. Application Data

[60] Continuation of Ser. No. 345,818, Nov. 21, 1994, abandoned, which is a division of Ser. No. 213,450, Mar. 15, 1994, Pat. No. 5,403,769, which is a division of Ser. No. 829,591, Feb. 3, 1992, Pat. No. 5,306,942, which is a continuation-in-part of Ser. No. 597,698, Oct. 10, 1990, abandoned.

[30] Foreign Application Priority Data

| Oct. 11, 1989 | [JP] | Japan | 1-265453 |
| Jan. 19, 1990 | [JP] | Japan | 2-11584 |

[51] Int. Cl.⁶ .......... H01L 29/00; H01L 27/01; H01L 27/12; H01L 31/0392

[52] U.S. Cl. .......... 257/501; 257/347; 257/350; 257/351; 257/500

[58] Field of Search .......... 257/347, 350, 257/351, 372, 374, 500, 501, 502

[56] References Cited

U.S. PATENT DOCUMENTS

| 3,722,079 | 3/1973 | Beasom | 437/62 |
| 3,865,649 | 2/1975 | Beasom | 437/54 |
| 3,990,102 | 11/1976 | Okuhara et al. | 257/524 |
| 4,599,792 | 7/1986 | Cade et al. | 29/576 W |
| 4,617,193 | 10/1986 | Wu | 156/643.1 |
| 4,661,202 | 4/1987 | Ochii | 156/643.1 |
| 4,748,485 | 5/1988 | Vasudev | 257/351 |
| 4,807,012 | 2/1989 | Beasom | 257/519 |
| 4,839,309 | 6/1989 | Easter et al. | 437/160 |
| 4,942,447 | 7/1990 | Park et al. | 257/369 |
| 4,963,505 | 10/1990 | Fujii et al. | 437/62 |
| 5,145,795 | 9/1992 | Sanders et al. | 437/33 |
| 5,164,218 | 11/1992 | Tsuruta et al. | 437/6 |
| 5,204,282 | 4/1993 | Tsuruta et al. | 437/62 |

FOREIGN PATENT DOCUMENTS

| 62-213272 | 9/1987 | Japan | 257/347 |
| 63-65641 | 3/1988 | Japan | 257/347 |
| 1112746 | 5/1989 | Japan | 257/347 |
| 1144665 | 6/1989 | Japan | 257/347 |
| 1225353 | 9/1989 | Japan | 257/347 |
| 1225349 | 9/1989 | Japan | 257/347 |
| 1226166 | 9/1989 | Japan | 257/347 |
| 1251635 | 10/1989 | Japan | 257/347 |
| 1302739 | 12/1989 | Japan | 257/347 |

OTHER PUBLICATIONS

Sugawara et al: "400V, 20A VLCS Power IC Technologies with a current sensing funtion", Proceeding of 1988 International Symposium on Power Semiconductor Devices, Aug. 22–23, 1988, pp. 121–126.

*Primary Examiner*—Steven H. Loke
*Attorney, Agent, or Firm*—Cushman, Darby & Cushman IP Group of Pillsbury Madison & Sutro LLP

[57] ABSTRACT

A semiconductor device of the type having a semiconductor substrate; a semiconductor layer disposed on the semiconductor substrate; a first element formed in a region of the semiconductor layer and having a perimeter including a bottom; a second element formed in another region of the semiconductor layer; an insulating layer surrounding the perimeter of the first element, for electrically insulating and separating the first element from the second element and the semiconductor substrate; an electrical shield layer disposed between the insulating layer and the first element, surrounding the perimeter of the first element, and adapted to a reference electric potential applied thereto, for shielding the first element from an electrical fluctuation of the semiconductor substrate caused by the second element; and an electrode for applying the reference electric potential to the electrical shield layer.

4 Claims, 34 Drawing Sheets

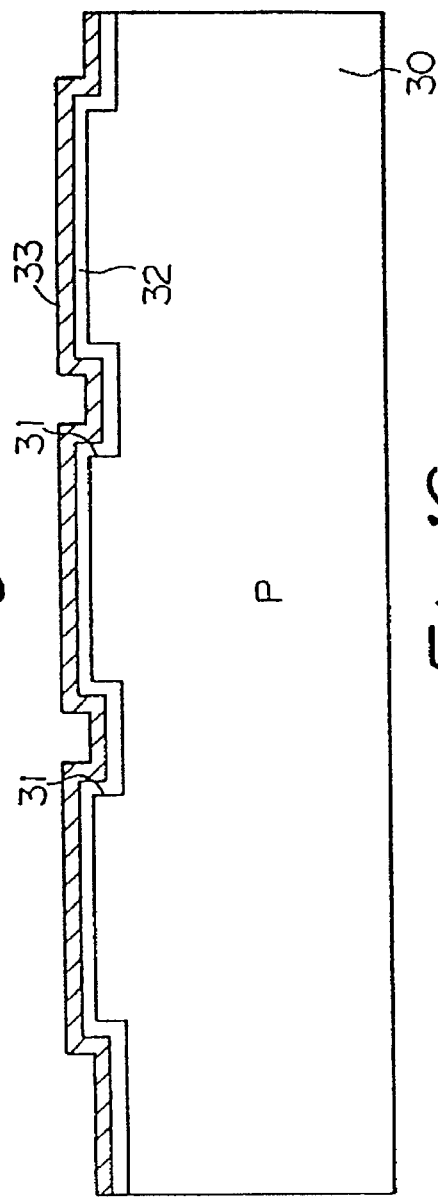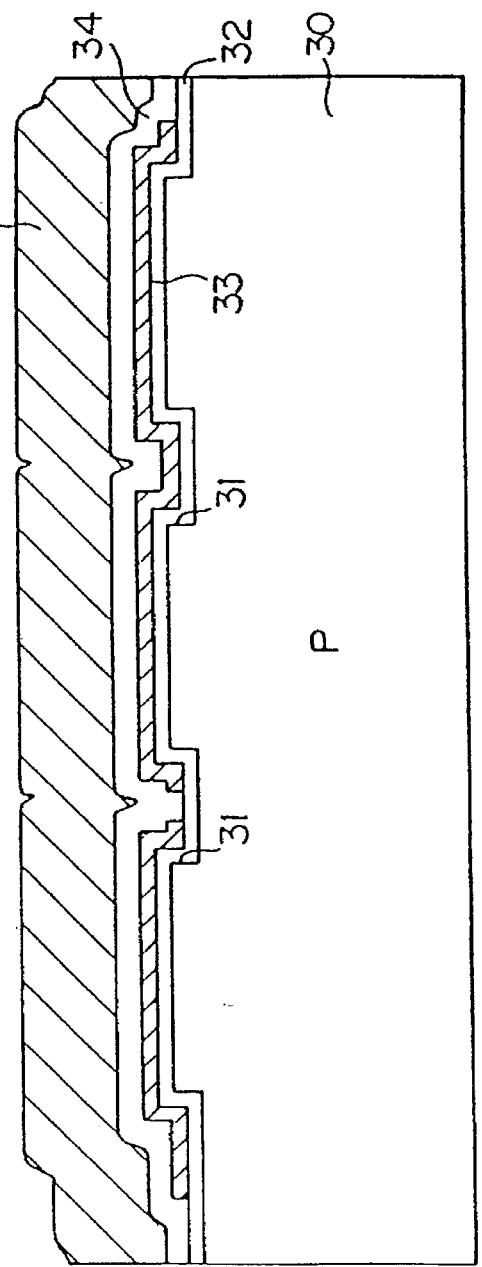

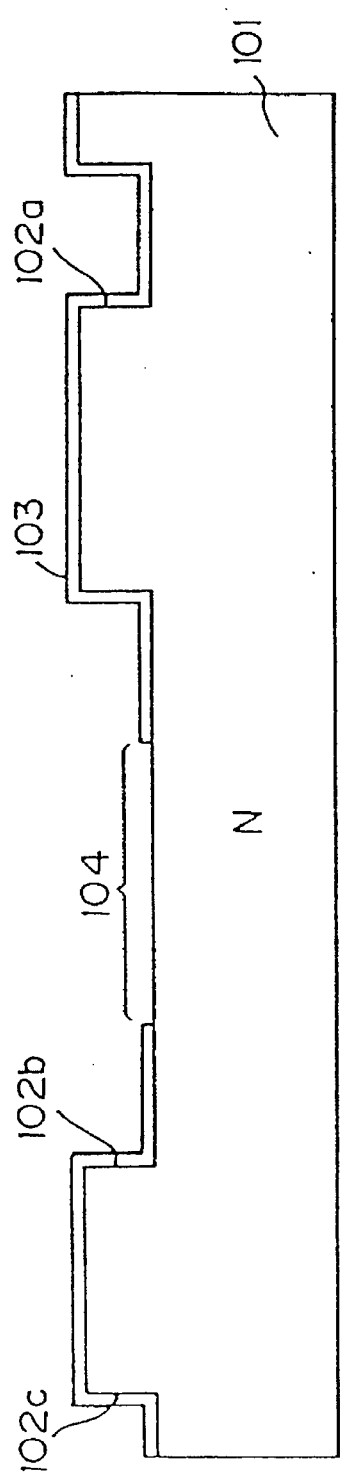
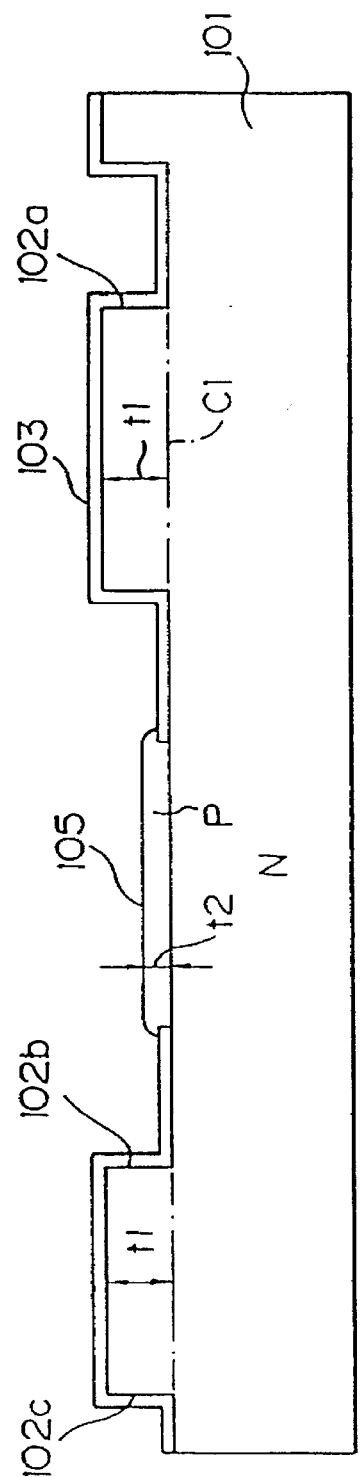

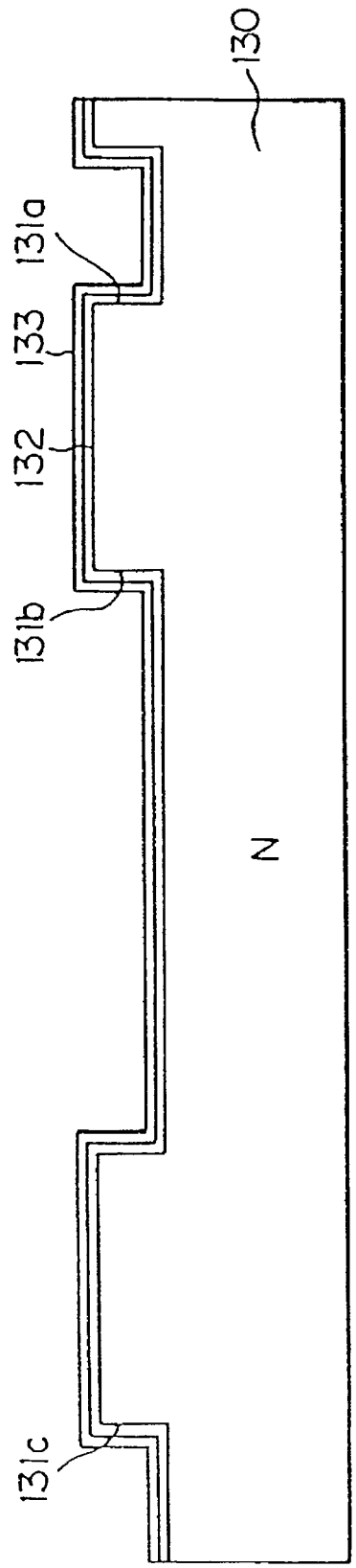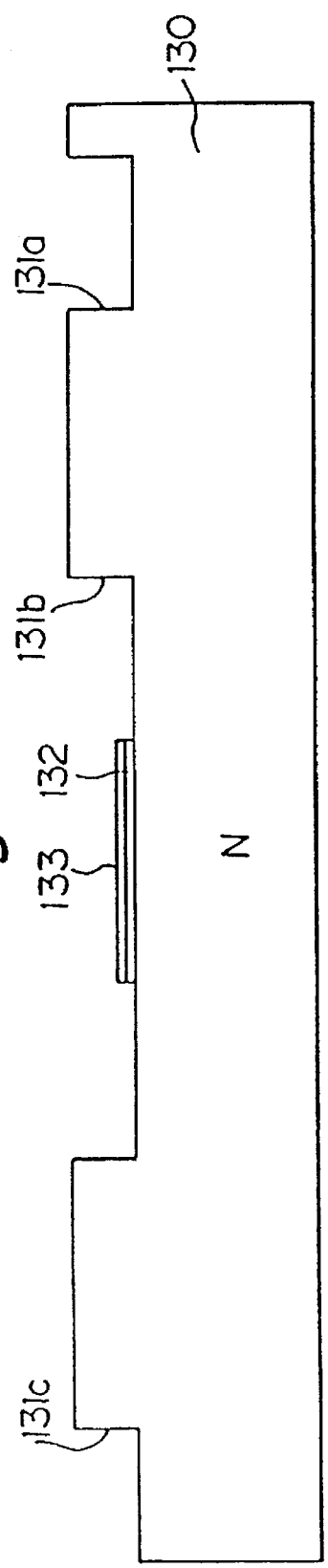

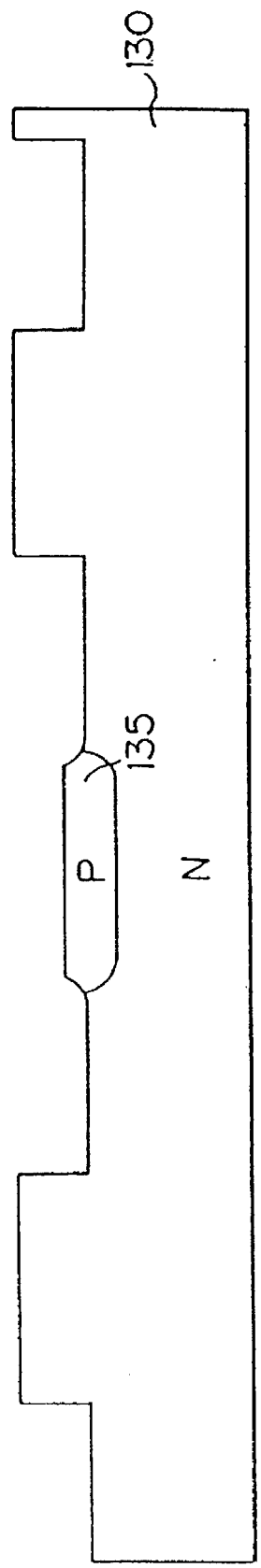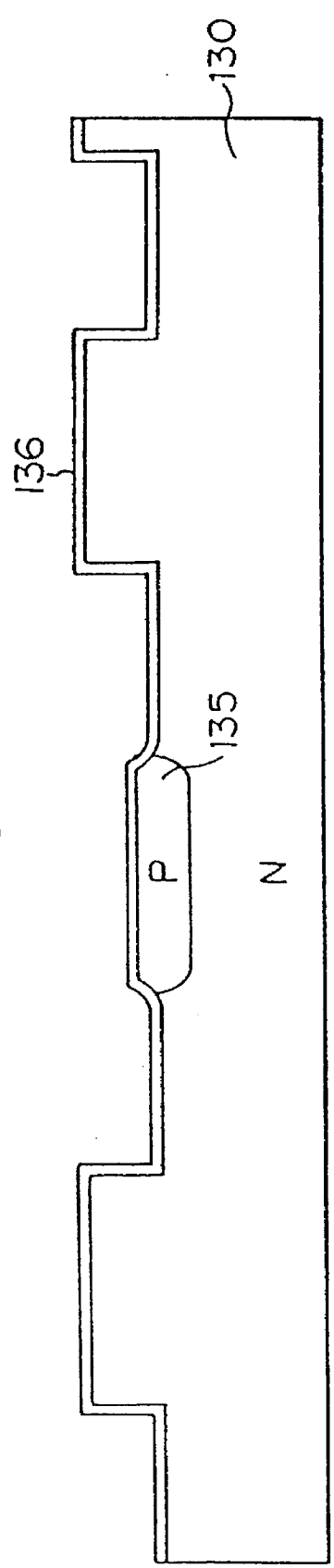

SEMICONDUCTOR DEVICE

This is a continuation of application Ser. No. 08/345,818, filed on Nov. 21, 1994, which was abandoned upon the filing hereof; which was a Division of 08/213,450 filed Mar. 15, 1994, now U.S. Pat. No. 5,403,769; which was a Division of 07/829,591 filed Feb. 3, 1992, now U.S. Pat. No. 5,306,942; which was a C.I.P. of 07/597,698 filed Oct. 10, 1990, now abandoned.

BACKGROUND OF THE INVENTION

1. Field of the Invention

The present invention relates to having an element formed in an insulated island portion of a semiconductor device.

2. Background Information

Conventionally, when an SOI (silicon-on-insulator) device formed on an insulator is combined or united with a device formed on a silicon substrate, such as a power MOS transistor, etc., the resultant increase in current capacity causes the substrate to act as a drain. Thereby, the device formed on the insulator occasionally becomes unstable due to a fluctuation of the drain voltage occurring upon operation of the power MOS transistor.

A solution to this problem was proposed in Japanese Unexamined Patent Publication (Kokai) No. 62-213272. In the proposed arrangement as shown in FIG. 1, on a LOCOS-oxidized film as a first insulating layer 201, an electroconductive thin film 204 as a shield is formed by the same process steps as the forming of the gate electrode 203 of a vertical MOS transistor 202, a second insulating layer 205 is formed on the electroconductive thin film 204, and semiconductor elements 206 and 207 are then formed on the second insulating layer 205 so that the thus formed SOI device is shielded from a fluctuation of the substrate electric potential due to the operation of a vertical MOS transistor.

In this arrangement, however, the SOI device portion naturally has a greater height than the vertical MOS transistor region as seen from FIG. 1, and the thus formed uneven or stepped surface causes a disconnection of conductor layers at the steps, particularly in highly integrated devices having a multilayered conductor structure.

Moreover, such an arrangement is not advantageous as an IC circuit in that an SOI device formed by depositing a polycrystalline silicon (hereinafter simply referred to as "polysilicon") on the second insulating layer cannot provide a high device performance as is obtained when an SOI device is formed in a monocrystalline silicon.

The present inventor intended to make even out or flatten respective surfaces on the SOI device portion and the vertical element portion. This arrangement, however, requires that an SOI device must be insulation-separated and shielded not only in the downward direction but also in the sideward direction, which causes a problem of increased and complicated process steps for the sideward insulation separation and shielding, including the formation of a trench hole from the surface, an insulating layer, a shield layer, and further, a connection between lower shield and side shield layers.

SUMMARY OF THE INVENTION

To solve the above problem, an object of the present invention is object to provide a semiconductor device in which electrical elements are protected from exterior disturbance and have a flat surface thereover, without increased and complicated process steps.

To achieve the above object according to the present invention, a semiconductor device comprises a semiconductor layer disposed on a semiconductor substrate. A first element is formed in a region of the semiconductor layer such that it is isolated completely on side walls and on a bottom surface by an insulating layer. A first electrical shield layer, disposed between the insulating layer and the first element, can be biased to a reference electric potential by the contact of an electrode at a thickened lateral portion of the first electrical shield layer.

A second element is formed in another region of the semiconductor layer, and a second electrical shield layer is disposed between an insulating layer and the second element. The second electrical shield layer is separately biasable to a second reference electric potential by the application of another electrode at a thickened lateral portion of the second electrical shield layer. The separate first and second shield layers having respective thickened portions for contact with electrodes provide for simultaneous application of separate bias voltages, whereby at least the first element is protected better from external electrical disturbance.

The electrical shield layers are electroconductive layers formed in the preferably formed of a doped polysilicon.

Preferably, a plurality of logic elements are formed as the first semiconductor element.

More preferably, the plurality of logic elements have respective silicon-on-insulator films of different thicknesses.

According to the present invention, both the first and second semiconductor elements are formed in a single semiconductor layer to obtain a flat or step-free surface of a semiconductor layer and prevent the disconnection of conductor layers which might otherwise occur as in the conventional technology, particularly in a highly integrated device having a multilayered conductor structure. The perimeter of the first semiconductor element or the region in which the first semiconductor element is formed, including the bottom of the first semiconductor element or the region, is surrounded by an insulating layer and an electrical shield layer, to ensure that a semiconductor device is protected from external disturbance and is electrically stable.

BRIEF DESCRIPTION OF THE DRAWINGS

FIGS. 2 through 13 are drawings for explaining Example 1 according to the present invention, in which:

FIGS. 2 through 6 are sectional views showing process steps according to the present invention;

FIG. 7 is a sectional view showing a semiconductor device according to the present invention:

FIGS. 8 and 9 are sectional views showing process steps according to the present invention:

FIG. 10 is a plan view showing a semiconductor device according to the present invention:

FIG. 11 is a sectional view showing a process step according to the present invention;

FIG. 12 is a sectional view showing a semiconductor device according to the present invention: and FIG. 13 is a sectional view showing a process step according to the present invention;

FIGS. 14 through 19 are drawings for explaining Example 2 according to the present invention, in which:

FIGS. 14 through 18 are sectional views showing process steps according to the present invention; and FIG. 19 is a sectional view showing a semiconductor device according to the present invention;

FIGS. 20 through 30 are drawings for explaining Example 3, including modifications thereof, according to the present invention, in which:

FIG. 20 is a sectional view showing a semiconductor device according to the present invention;

FIGS. 21 through 26 are sectional views showing process steps according to the present invention; and FIG. 27 is a sectional view showing a semiconductor device as a modification of FIG. 20;

FIGS. 28 and 29 are sectional views showing process steps for producing the semiconductor device of FIG. 27.

FIGS. 31 through 42 are drawings for explaining Example 4, including modifications thereof, according to the present invention, in which:

FIGS. 31 through 39 are sectional views showing process steps according to the present invention;

FIG. 40 is a sectional view showing a semiconductor device according to the present invention; and FIGS. 41 and 42 are sectional views showing modified Process steps;

FIGS. 43 through 54 are drawings for explaining Example 54 according to the present invention, in which:

FIGS. 43 through 53 are sectional views showing process steps according to the present invention; and FIG. 54 is a sectional view showing a semiconductor device according to the present invention.

DESCRIPTION OF THE PREFERRED EMBODIMENTS

EXAMPLES

Example 1

Figure 1:
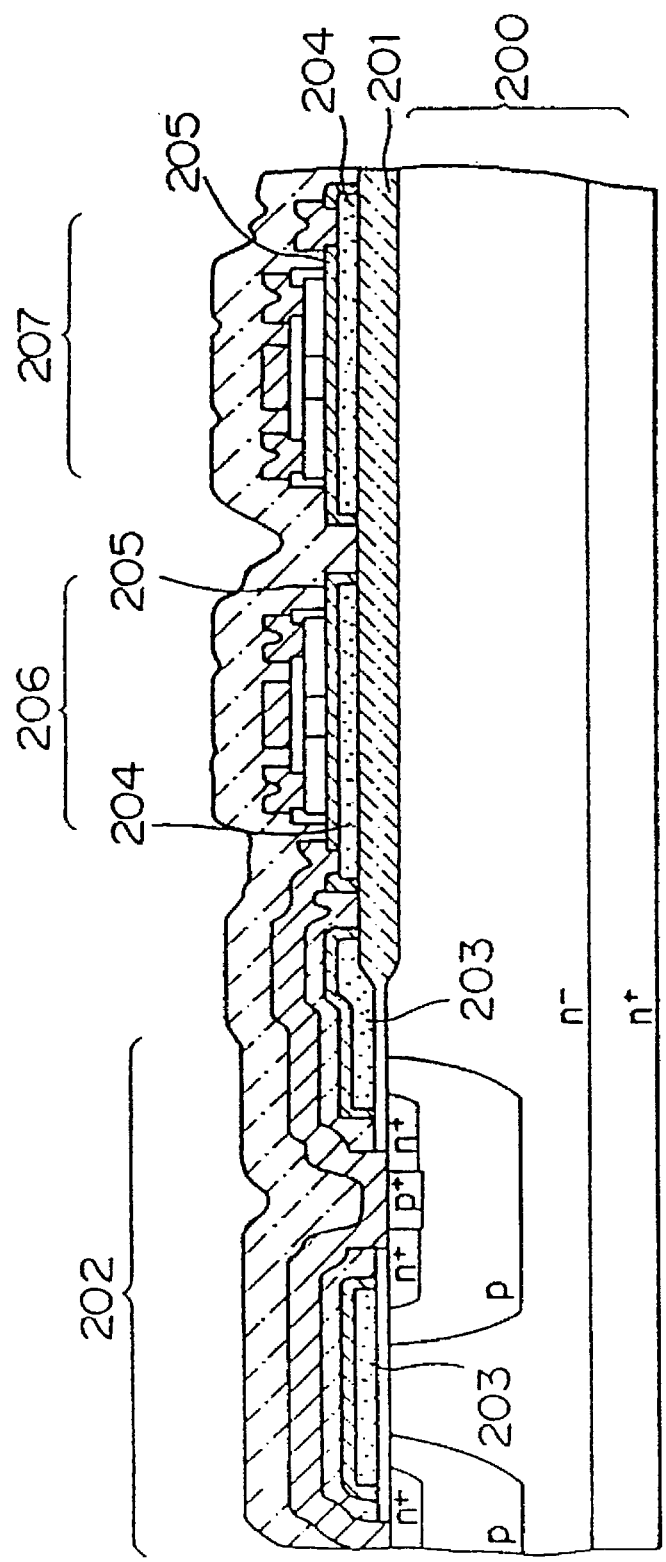
FIG. 1 is a sectional view showing a conventional arrangement for shielding SOI devices from substrate electric potential fluctuation.
Figure 2:
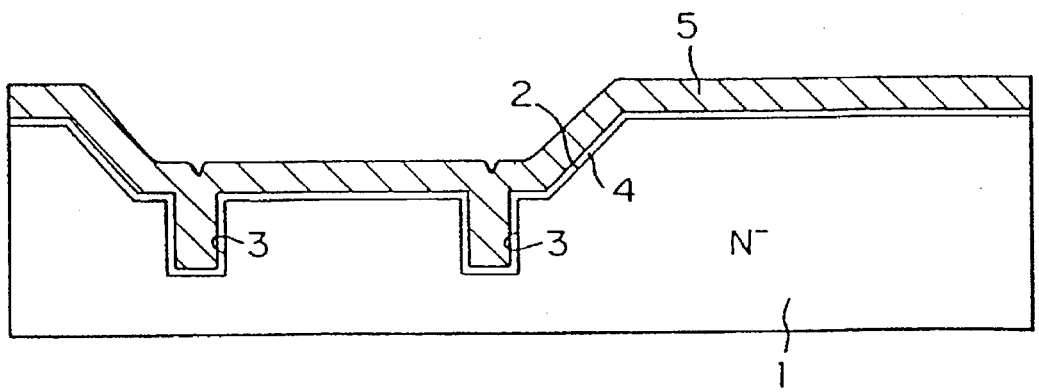

As shown in FIG. 2, a concavity 2 having a depth of from 0.5 μm to several μm is formed on one of the principal surfaces of a silicon substrate 1 or a first semiconductor substrate by an alkali etching, for example. An N-type (100) silicon (1 to 10 Ω-cm) is used as the silicon substrate 1. A groove 3 in the form of a ring having a predetermined depth is then formed in the substrate 1 within the concavity 2 by dry etching, etc. A silicon oxide film 4 as an insulating layer is formed on the entire surface of the substrate 1 including the groove 3 by thermal oxidation, etc. A doped polysilicon film 5 as an electrical shield layer doped with phosphorous or arsenic in a high concentration is formed on the entire surface of the substrate 1, and thereby fills the groove 3.

Figure 3:
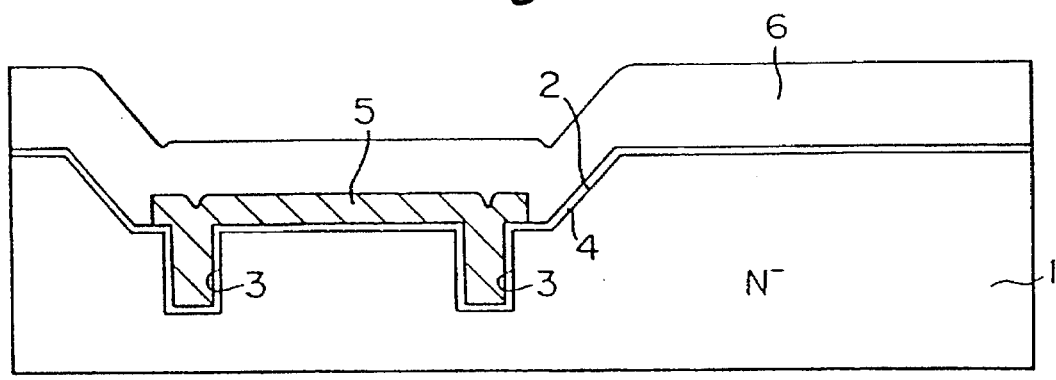
Figure 4:
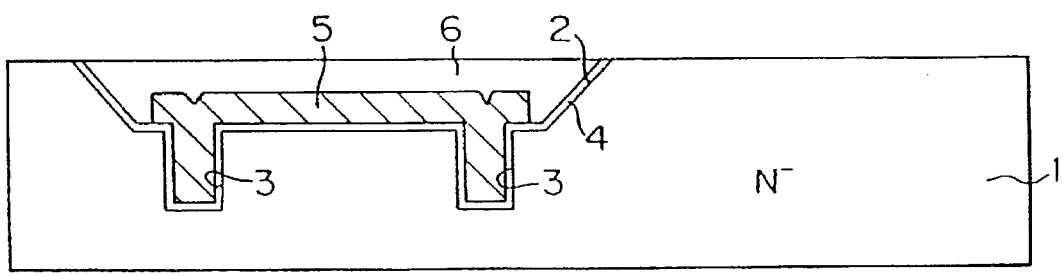

As shown in FIG. 3, the doped polysilicon film 5 is removed from portions other than the concavity 2 and the groove 3. The principal surface of the substrate 1 is covered with a silicon oxide film 6 as an insulating layer by CVD (chemical vapor deposition) so that the concavity 2 is filled with the silicon oxide film 6, and then a densification is carried out at a temperature of from 800° to 1200° C. Subsequently, as shown in FIG. 4, of the substrate 1 is flattened by mirror-polishing the surface until the silicon substrate 1 is exposed in the portion surrounding or outside the concavity 2.

Figure 5:
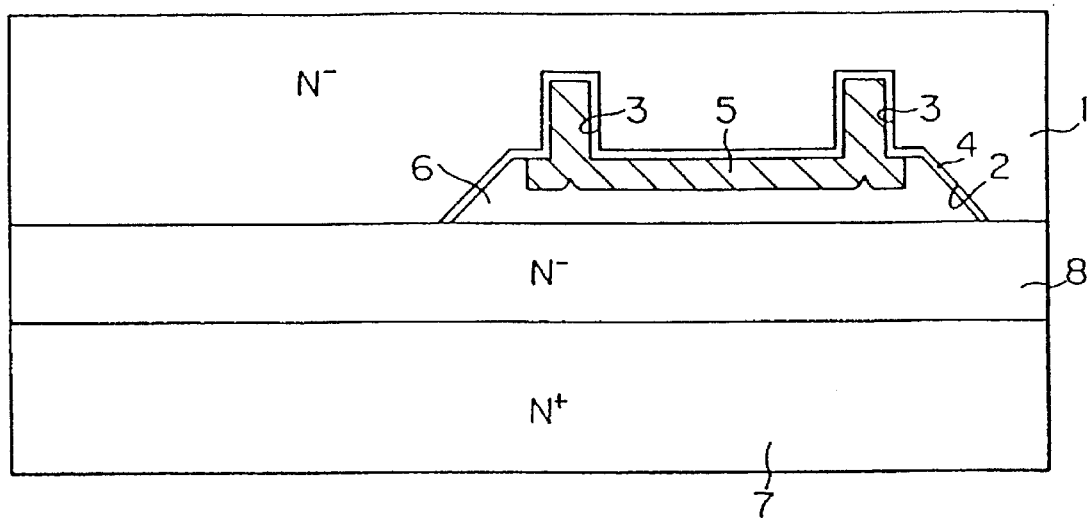

Next, as shown in FIG. 5, an $N^-$ epitaxial layer 8 is formed on a second substrate 7 or an $N^+$ type silicon substrate (0.005 to 0.02 Ω-cm), and the N epitaxial layer 8 is then mirror-polished by a predetermined amount. The purpose of this polishing is to prevent the occurrence of voids and the like during the following step of direct bonding the two substrates due to any protrusions on the N epitaxial layer 8 caused by a minute amount of dust and flaws during the epitaxial growth of the N epitaxial layer 8. The epitaxial layer 8 is formed to an excessive thickness corresponding to a thickness lost by polishing. The surface of the N epitaxial layer 8 is subjected to a hydrophilic treatment with an aqueous solution of $H_2O_2+H_2SO_4$, for example. The thus treated surface of the N epitaxial layer 8 of the second substrate 7 is directly bonded to the principal surface of the first substrate 1 by a heat-treatment at 800° to 1200° C. for 30 minutes to 5 hours in a nitrogen atmosphere, to bond the first and second substrate 1 and 7.

Figure 6:
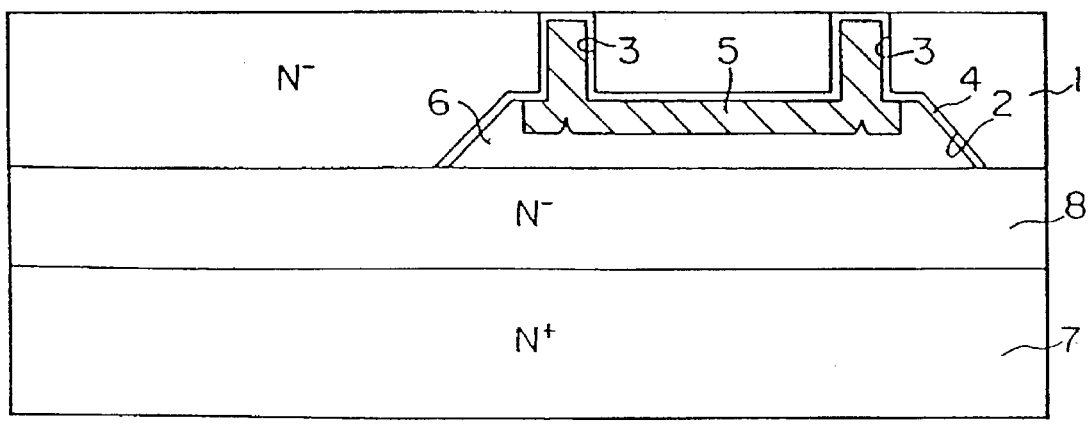

As shown in FIG. 6, the reverse side of the first substrate 1 is roughly polished or lapped, so that about 10 to 20 Ωm of the first substrate 1 remains, and then mirror-polished by mechanical-chemical polishing (or selective polishing) until the silicon oxide film 3 the bottom of the groove 4 is exposed. This provides an element formation region in a part of the substrate 1 isolated by the silicon oxide films 4 and 6, in which region the source, the drain, and the gate of a transistor are formed.

Figure 7:
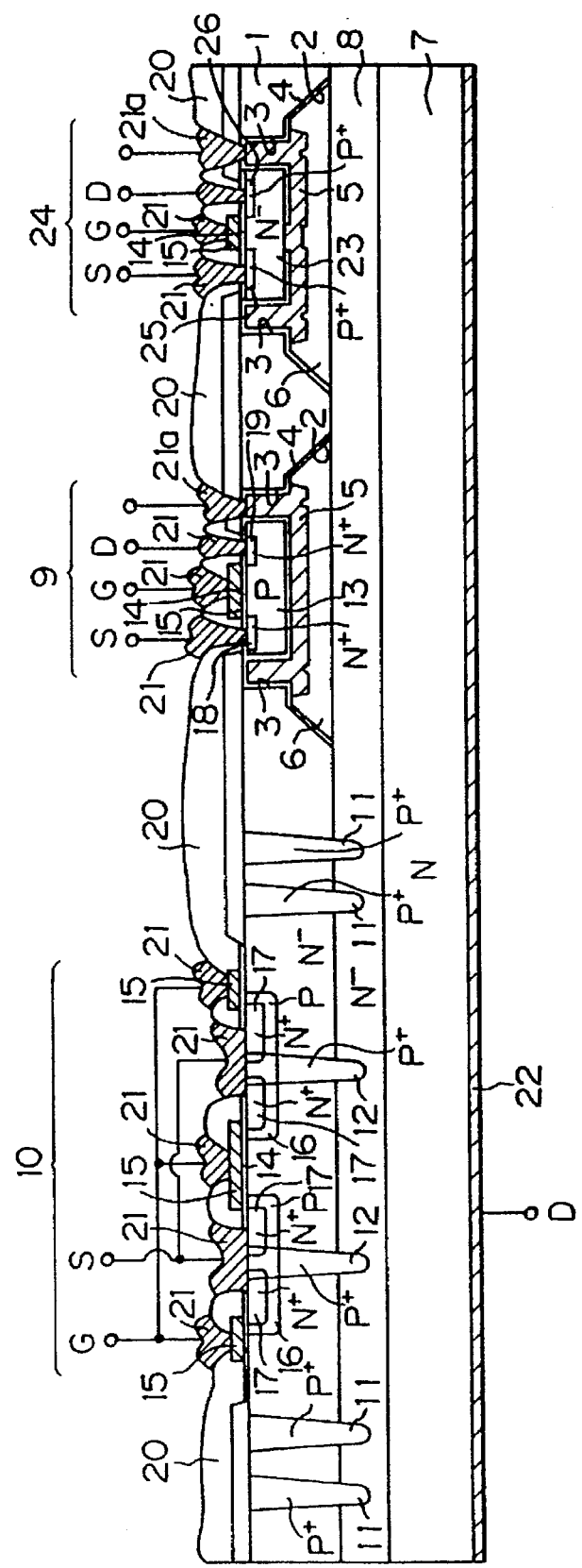

FIG. 7 shows a semiconductor device having a transistor produced by the above process. This semiconductor device has an N channel power MOS transistor 9 and an N channel MOS transistor 10 and is produced by the following process.

First, a boron ion implantation is carried out to form a $P^+$ girdling region 11 and a $P^+$ region 12 of an N channel power MOS transistor 10 and a P well region 13 of a N channel MOS transistor 9. After forming a 300 to 800Å thick gate oxide layer 14, a polysilicon gate 15 is formed of a phosphorous-doped polysilicon. Subsequently, a P region 16 and an $N^+$ region 17 of the N channel power MOS transistor 10 as well as an $N^+$ source region 18 and an $N^+$ drain region 19 of the N channel MOS transistor 9 are formed. Thereafter, an interlayer film 20, electrode layers 21 including the electrode layer 21a of the doped polysilicon layer 5, and a reverse side electrode (or drain electrode) 22 of the N channel power MOS transistor 10 are formed. A predetermined voltage is applied to the electrode layer 21a electrically connected to the doped polysilicon film 5.

To summarize the above-described process according to the present invention, a groove 3 for partitioning an element formation region is formed on a principal surface of a silicon substrate 1 (or a first semiconductor substrate), silicon oxide films (or insulating layers) 4 and 6 and a doped polysilicon film (or electrical shield layer) 5 are formed on the principal surface of the silicon substrate 1 including the groove 3, the principal surface of the silicon substrate 1 and the epitaxial layer 8 of another substrate 7 are bonded, the reverse side of the bonded silicon substrate 1 is polished to partially remove the substrate 1 by a predetermined amount so that the silicon oxide film 4 and doped polysilicon film 5 are-located near the rear side surface, and an N channel MOS transistor 9 is formed in the element formation region of the silicon substrate 1.

This N channel MOS transistor 9 has a silicon substrate 1 (or a semiconductor layer) having a flattened surface, an element formation region on a portion of the silicon substrate 1, silicon oxide films (or insulating layers) 4 and 6 surrounding the perimeter of the element formation region including the bottom of this region, and a doped polysilicon film (or electrical shield layer) 5 surrounding the perimeter of the element formation region including the bottom of this region. Thus, the perimeter of the element formation region, including the bottom of this region, in the silicon substrate (or a semiconductor layer) having a flattened surface is surrounded by the silicon oxide films (or insulating layers) 4 and 6 and the doped polysilicon film (or an electrical shield layer) 5, to ensure a protection from exterior disturbance and an electrical stability, i.e., any fluctuation of the drain voltage of the N channel power MOS transistor 10 does not affect the stable operation of the N channel MOS transistor 9.

The application of a voltage to the doped polysilicon film 5 can further stabilize the electric potential of the base portion of the N channel MOS transistor 9 against the drain voltage fluctuation of the N channel power MOS transistor 10. The flat surface of the silicon substrate 1 obtained by polishing is advantageous in the production of highly integrated devices.

The element formation region (of the semiconductor layer in which electrical elements are formed) is formed by directly bonding two substrates or wafers, to ensure a good crystallinity and a low production cost.

Some possible modifications will be described below.

Figure 8:
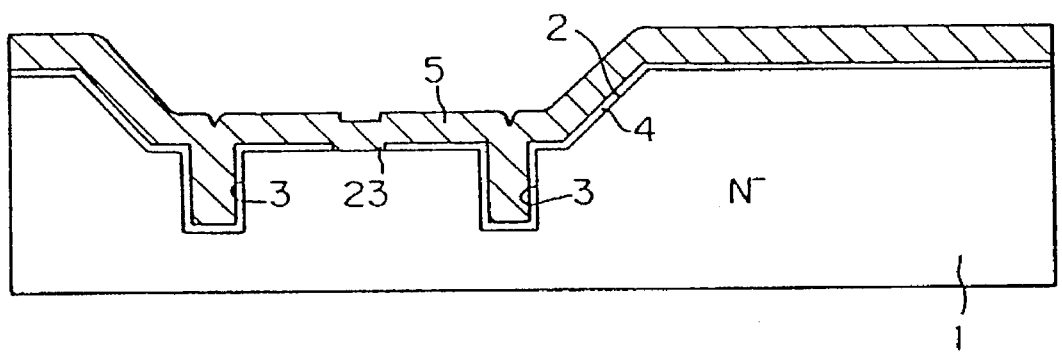

FIG. 8 shows a modification, in which, after formation of the silicon oxide film 4, a region 23 in which the silicon oxide film 4 is removed is formed in the concavity 2 to connect electrically the silicon substrate 1 and the doped polysilicon film 5. Namely, as shown by a P channel MOS transistor 24 in FIG. 7, a $P^+$ source region 25 and a $P^+$ drain region 26 are formed and a predetermined voltage is applied from the electrode 21a to the silicon substrate 1 via the oxide-removed region 23. Thus, the base voltage of the P channel MOS transistor 24 can be controlled and stabilized against the external disturbance, including a kinking phenomenon, a fluctuation of the threshold voltage VT, and a leak current.

Figure 9:
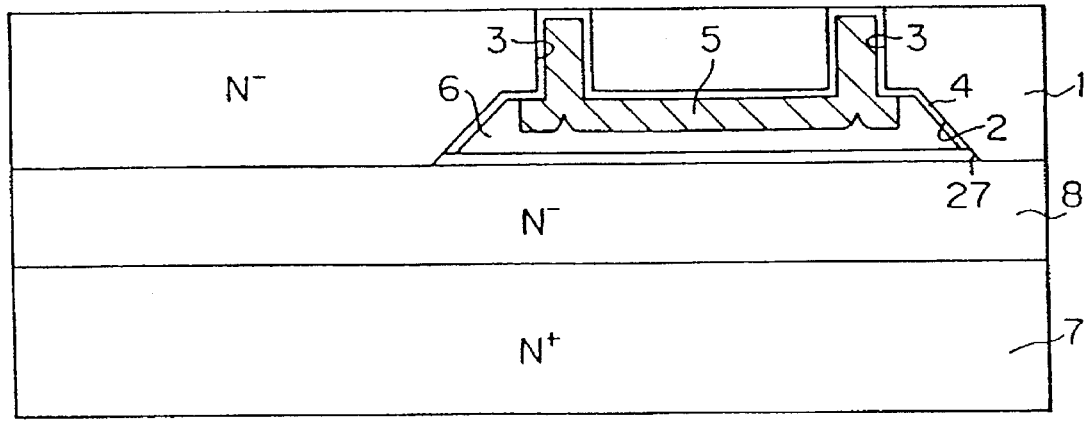

FIG. 9 shows another modification, in which a space 27 is formed between the silicon oxide film 6 in the concavity 2 of the silicon substrate 1 and the epitaxial layer 8 of the silicon substrate 7.

Figure 10:
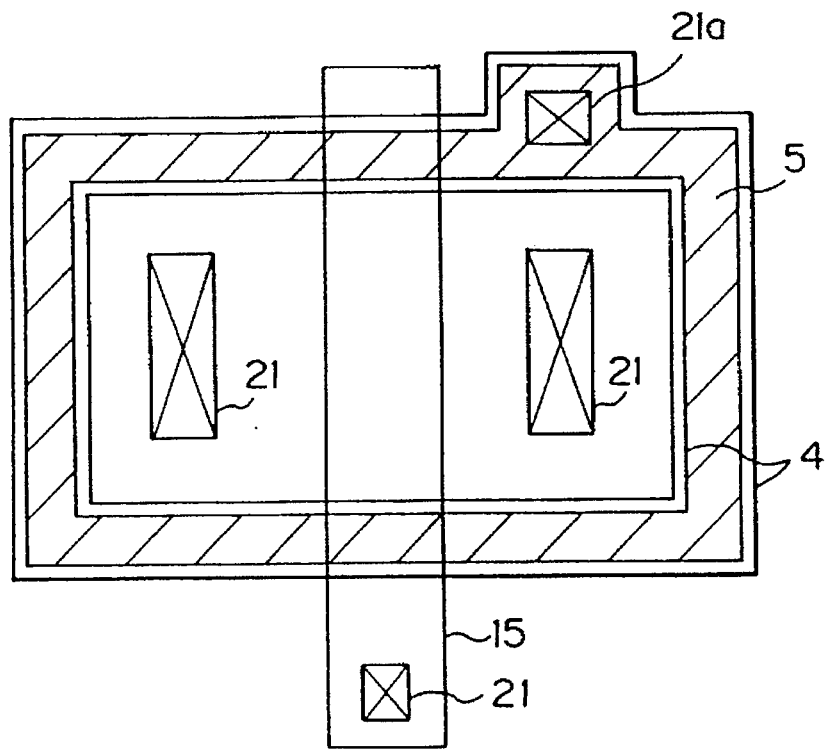

FIG. 10 shows another modification, in which a doped polysilicon film 5 has a greater width to secure the electrical connection.

Figure 11:
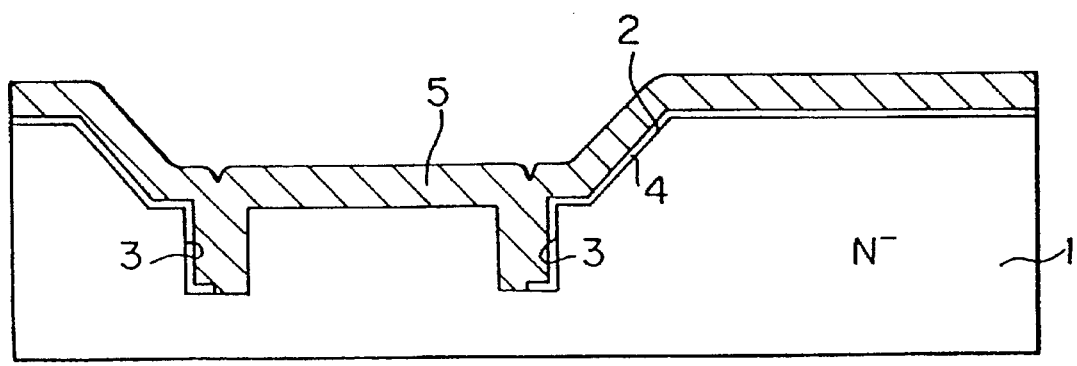
Figure 12:
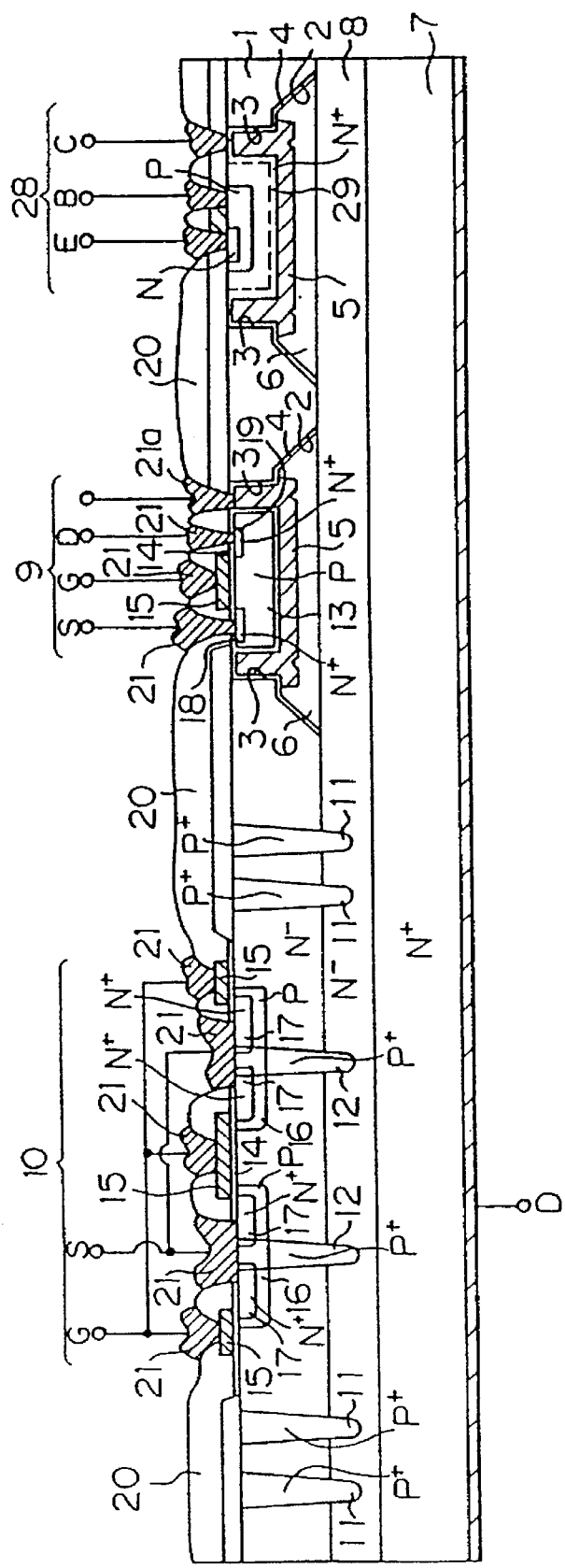

FIG. 11 shows another modification, in which, after formation of a silicon oxide film 4 covering the entire surface of the silicon substrate 1, the silicon oxide film 4 is partially removed by etching in the concavity 2 and the groove 3, for example, and a doped polysilicon film 5 doped with arsenic (As) at a high concentration is formed. An NPN bipolar transistor 28 as shown in FIG. 12 is formed, and an $N^+$ filled layer and a deep $N^+$ layer are formed on the As-doped polysilicon film 5, and an $N^+$ diffused layer 29 is formed in the film 5 by thermal diffusion. A lower collector resistivity and thus a high speed, high-performance bipolar transistor is obtained.

In the NPN bipolar transistor 28 of the SOI (silicon-on-insulator) portion of FIG. 12, the doped polysilicon film 5 also acts as a gettering layer for gettering heavy metals, because the film 5 is in direct contact with the monocrystalline silicon 29.

Figure 13:
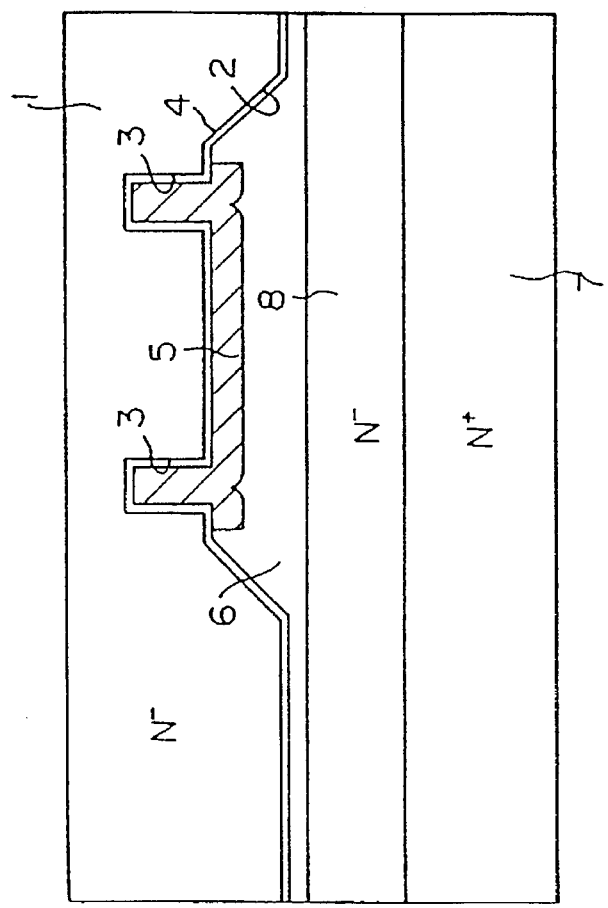

Instead of the integration of a power MOS transistor with a MOS transistor in an SOI portion or with a bipolar transistor as hereinbefore described, an SOI portion only may be utilized to obtain a high performance semiconductor device. In this case, as shown in FIG. 13, for example, the silicon oxide film 6 is polished to such an extent that it remains over the entire surface of the silicon substrate 1, and then bonding of the wafers is carried out. Such a bonding may be effected by using BPSG (borophosphosilicate glass), PSG (phosphosilicate glass), a soft glass or the like formed on the silicon oxide layer 6. The polysilicon layer is then polished and flattened, and then the bonding is carried out.

The conducting types of a semiconductor can be changed by a substitution between N and P types to form different devices. The conducting types of the doped polysilicon film 5 may also be P or N type or both P and N types.

In a further modification, the surface layer of the silicon oxide film 6 in the concavity 2 is partially removed to a predetermined depth, a polysilicon is disposed in the oxide-removed portion, and the silicon substrate 1 is bonded to the epitaxial layer 8 of the silicon substrate 7 via the polysilicon layer. This provides a better bonding than that of the silicon oxide film 6 and the epitaxial layer 8 of the silicon substrate 7.

Instead of polishing the reverse side of the silicon substrate, etching may be used to expose the silicon oxide film 4 in the groove 3 and the doped polysilicon film 5 near the surface.

The groove 3 defining an element formation region is not necessarily a ring. For example, when an element formation region is formed in the corner of a square silicon substrate 1, grooves may be formed at two or three sides of a square element formation region.

Example 2

The following is another embodiment according to the present invention, in which the power device portion is described in detail, omitting the illustration and description on the SOI device portion, though it is included.

Figure 14:
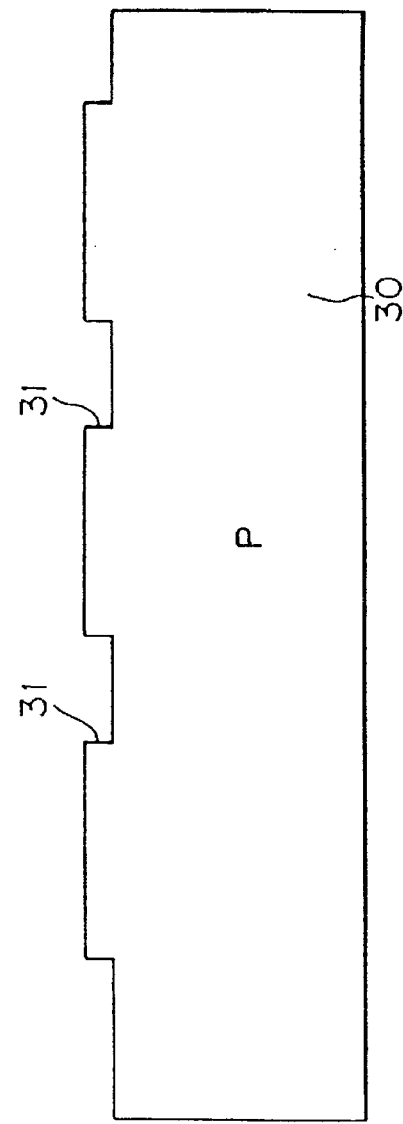

As shown in FIG. 14, a 0.1 to several $\Omega$m deep groove 31 in the form of a ring is formed on a P type (100) silicon substrate (1 to 50 $\Omega$-cm) or a first semiconductor substrate 30 by dry etching. The groove 31 may otherwise be formed by locally forming a LOCOS oxide film and then removing it. The groove 31 is supposed to have a depth of 0.1 to 0.3 $\Omega$m in the following description.

A 0.01 to 1 $\Omega$m thick thermally oxidized film 32 is then formed as an insulating layer covering the entire surface of the silicon substrate 30, followed by the formation of an electrical shield layer or a doped polysilicon film 33 doped with phosphorus in a high concentration and having a thickness of 0.1 to 0.5 $\Omega$m. The doped polysilicon film 33 is partially patterned to form electrically isolated pattern components, as shown in FIG. 16. Subsequently, a CVD silicon oxide film 34 having a thickness of 0.5 to 1 $\Omega$m, for example, is formed on the substrate 30. A 3 to 5 $\Omega$m thick polysilicon film 35 is formed in the upper portion of the silicon oxide film 34.

Figure 17:
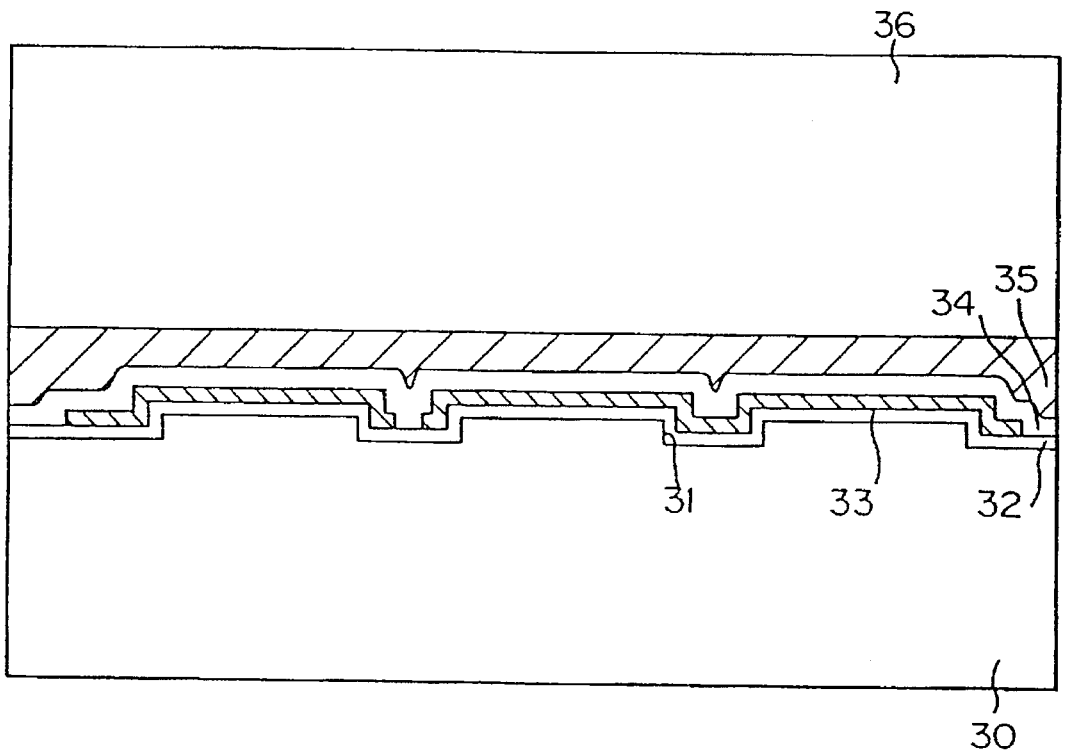
Figure 18:
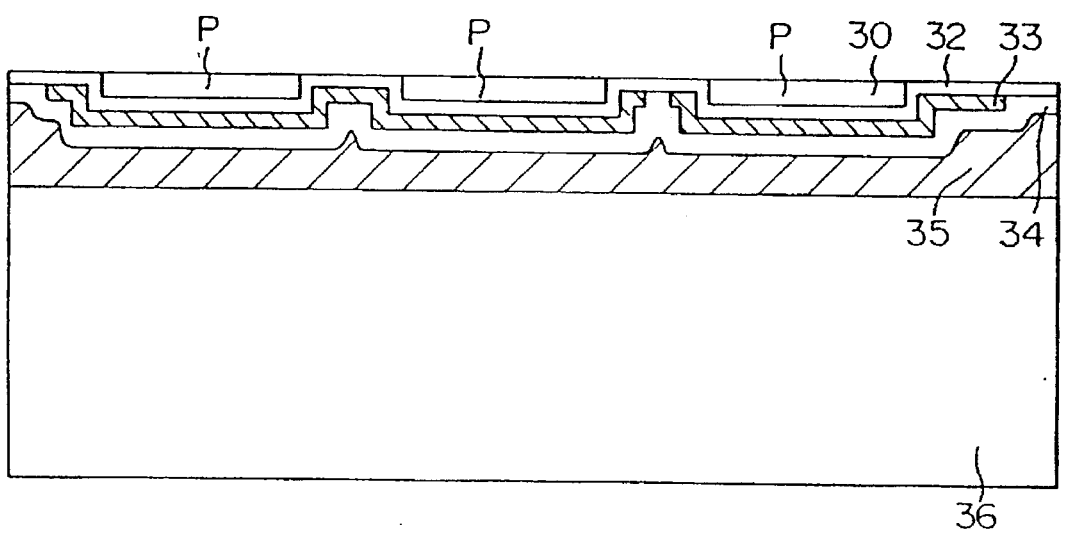

As shown in FIG. 17, the surface of the polysilicon film 35 is mirror-polished to be flat by lapping, "fine polishing", etc. The polished first substrate 30 is then bonded directly to a second substrate or a silicon substrate 36. The reverse side of the silicon substrate 30 is polished by lapping, selective polishing, or the like, until the thermally oxidized layer 32 is exposed to form an SOI layer surrounded by the thermally oxidized layer 32.

Figure 19:
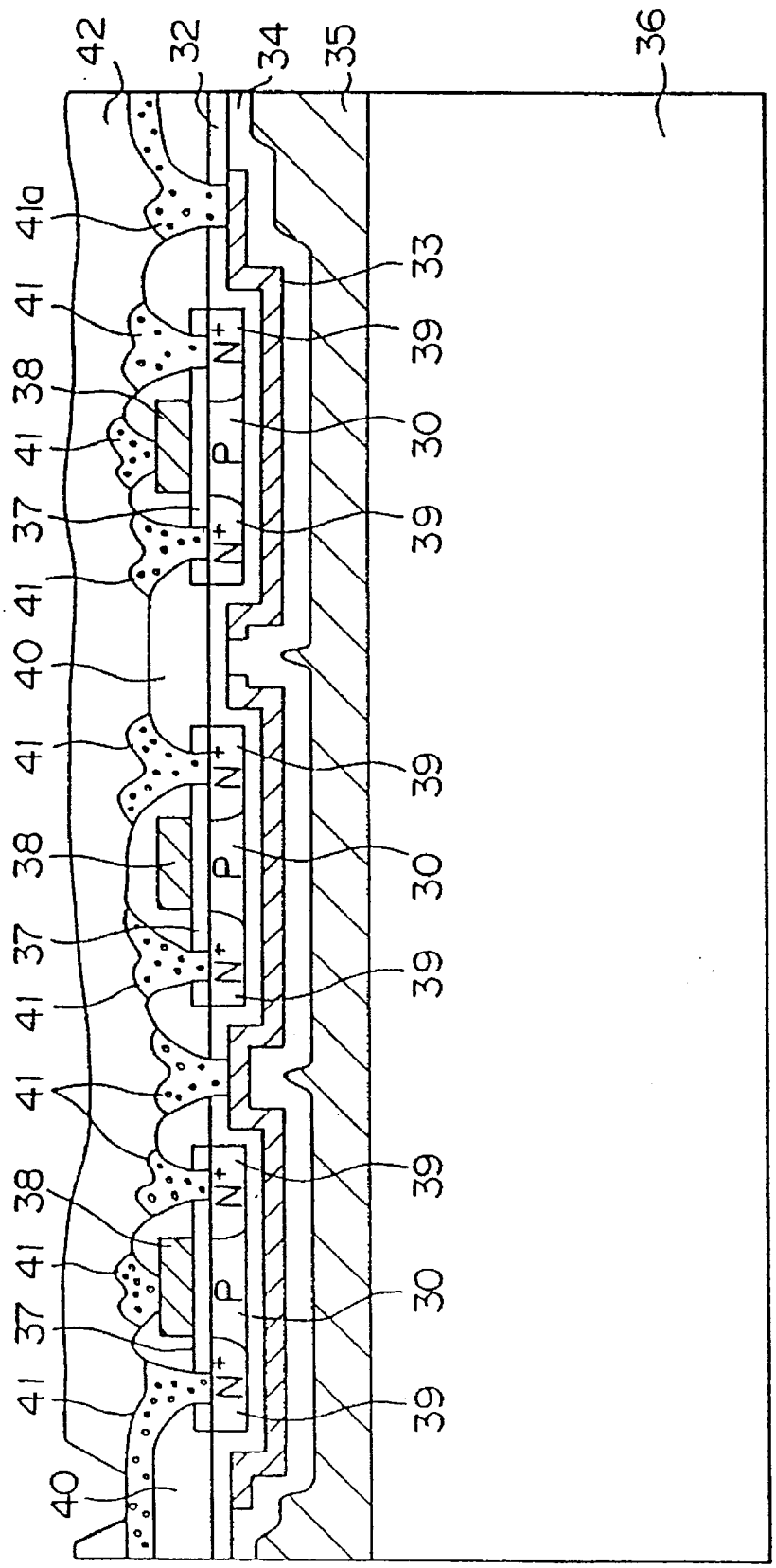

As shown in FIG. 19, a MOS transistor is formed by a usual IC process, including the formations of a gate oxide film 37, a polysilicon gate 38, a source-drain region 39 implanted with As ions, an interlayer film 40 of BPSG, electrode layers 41 including an electrode layer 41a for effecting an electrical contact to the doped polysilicon film 33, and a passivation film 42.

The SOI layer of Example 2 is stabilized in the same manner as in Example 1 by a voltage applied to the doped polysilicon film 33 via the electrode layer 41a.

Control of the MOS transistor current may be also effected by the same voltage as the gate voltage when the thermally oxidized layer 32 and the gate oxide film 37 have an equivalent thickness.

In a modification of Example 2, the doped polysilicon film 33 and the silicon substrate 30 are electrically connected as in Example 1, FIG. 11.

Other modifications are possible, in which a P channel MOS transistor is also formed, or P and N channel MOS transistors are combined to form a CMOS device.

Example 3

Figure 20:
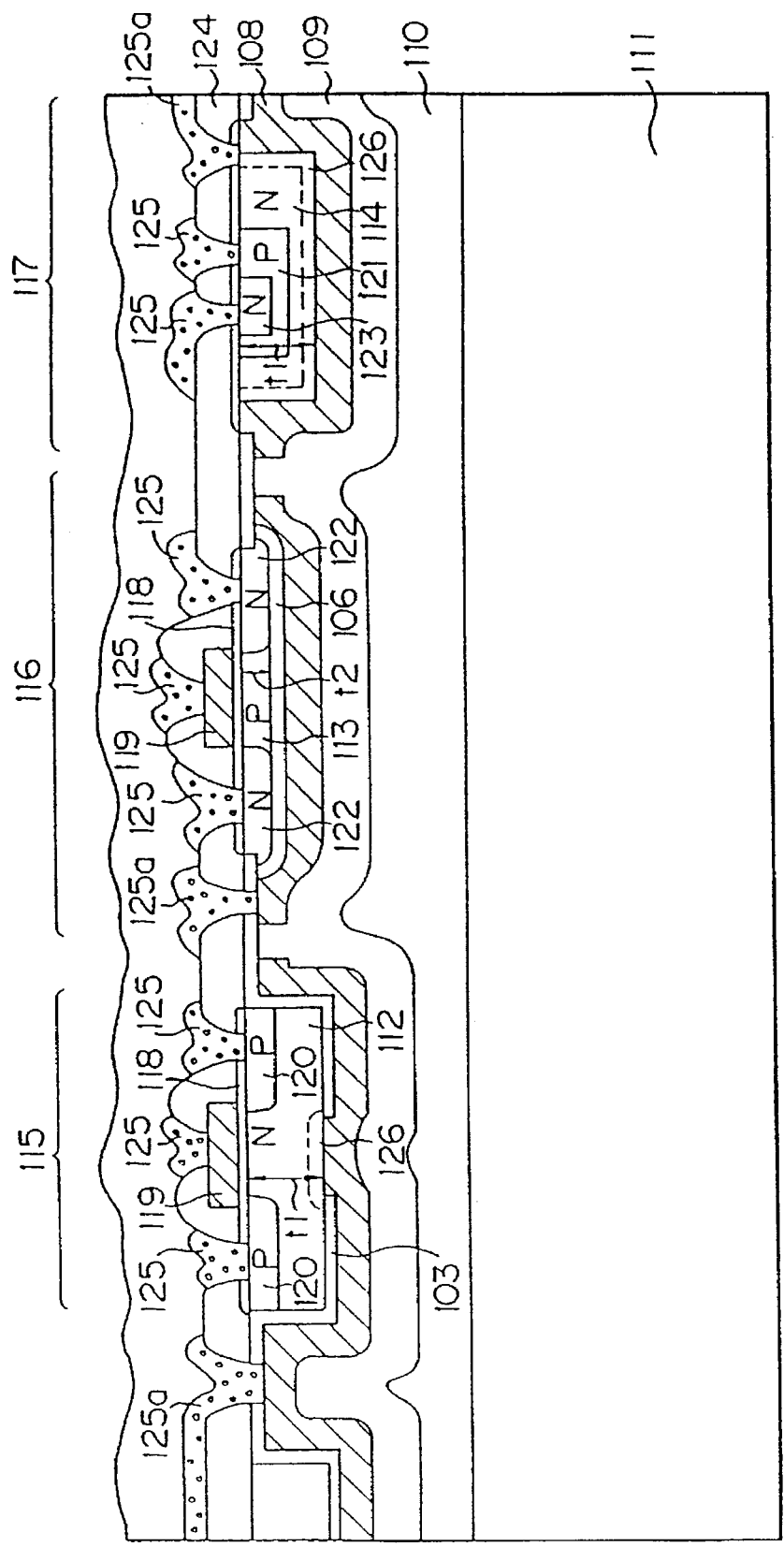

FIG. 20 shows a semiconductor device according to the present invention and FIG. 21 through 26 show the process steps for producing the same.

In FIG. 21, in a predetermined region of an N type (100) silicon substrate as a first substrate 101 of 1 to 50 Ω-cm, concavities 102a, 102b, and 102c are formed by dry etching or the like. Subsequently, a 0.1 to 1 Ωm thick silicon oxide film 103 or a mask is formed by thermal oxidation to cover the principal surface of the substrate 101. The silicon oxide film 103 is then removed in a predetermined region in the concavity 102b by etching to form a removed portion 104.

As shown in FIG. 22, a P type silicon layer 105 is formed in the removed portion 104 by a selective epitaxial growth process. This selective epitaxial layer 105 may be thicker than the silicon oxide layer 103, although the former has a greater thickness than the latter in FIG. 22. This provides semiconductor layers having bottoms defined by a reference plane C1 and which protrude from the principal surface by heights t1 and t2 with respect to the reference plane C1.

Figure 23:
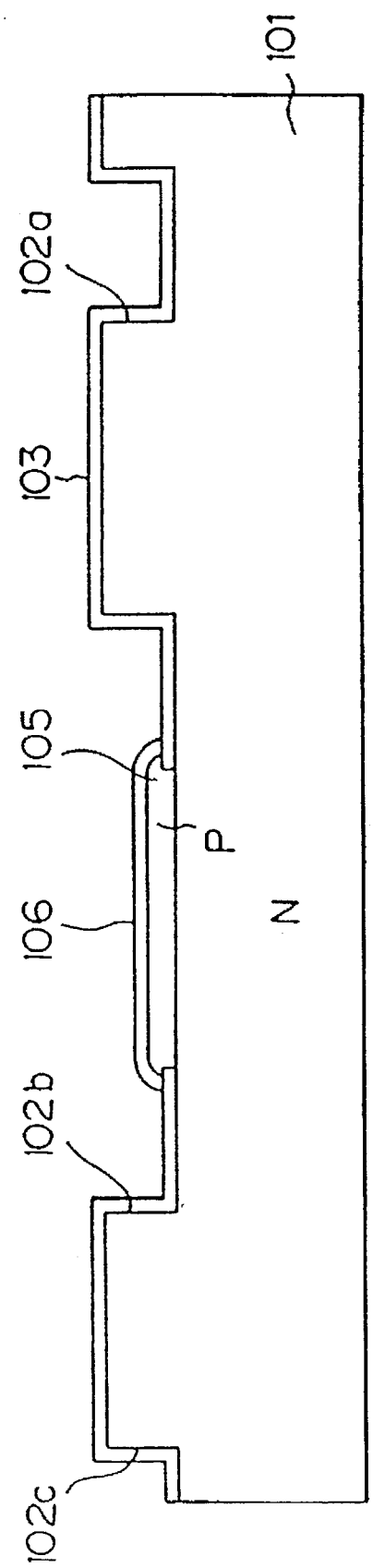
Figure 24:
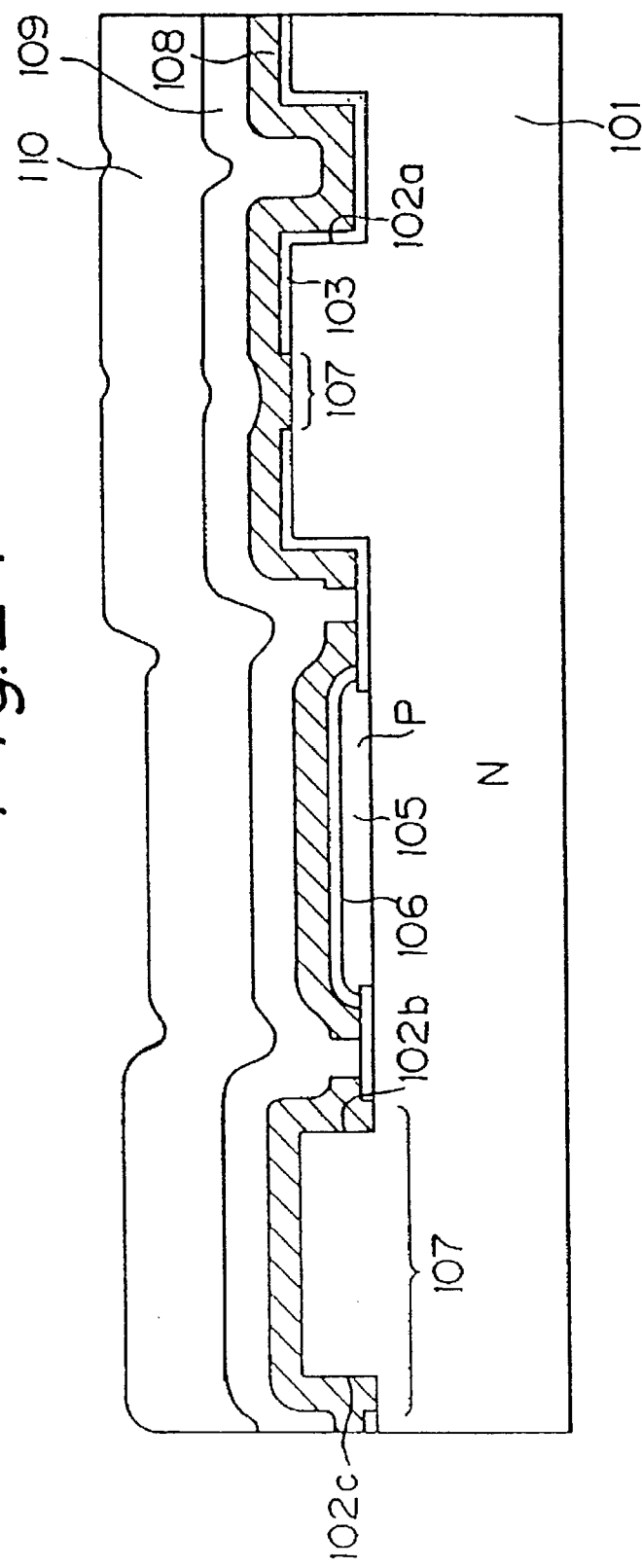

A silicon oxide film 106 is formed on the selective epitaxial layer 105 by thermal oxidation, etc., as shown in FIG. 23, and is then partially removed to form a substrate contact portion 107 as shown in FIG. 24. An arsenic-doped polysilicon film 108 is formed on the silicon oxide film 103 by LPCVD, for example. The doped polysilicon film 108 may be otherwise doped with other impurities other than arsenic (As), it may be substituted with another film of a high-melting point metal such as wolfram or of a chemical compound thereof, and it may be a combination therebetween. The doped polysilicon film 108 is then patterned by removing predetermined portions thereof by dry etching, etc.

Figure 25:
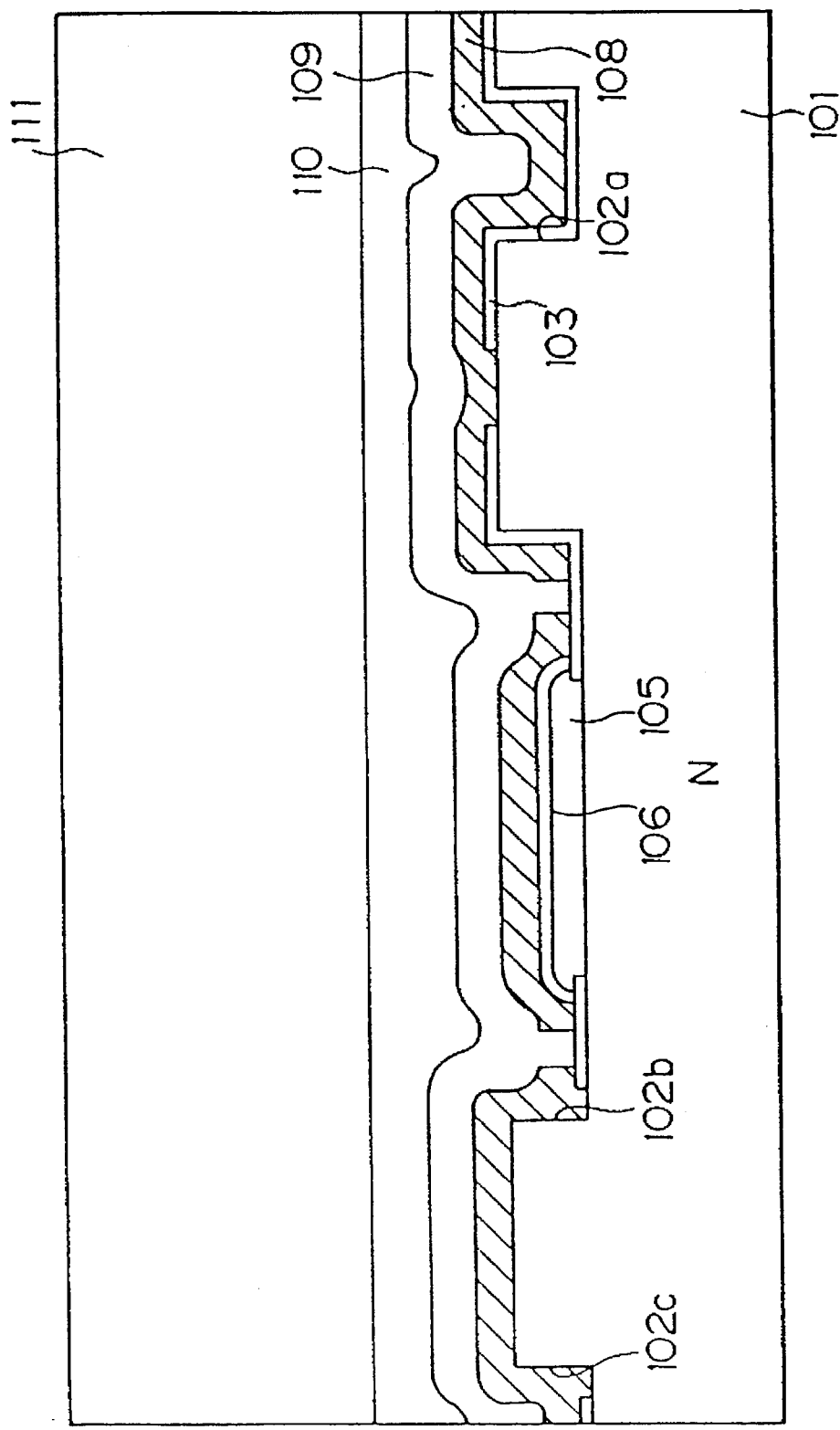

Next, a silicon oxide film 109 or an insulating film is formed on the doped polysilicon film 108 by CVD and a polysilicon film 110 is then formed on the silicon oxide film 109. Subsequently, as shown in FIG. 25, the surface of the polysilicon film 110 is flattened by mirror polishing, etching, etc. Although the polysilicon film 110 formed on the silicon oxide layer 109 is flattened in this example, a flat surface can be otherwise obtained by forming a thicker silicon oxide film 109 and flattening the oxide film surface.

The flattened surface of the polysilicon film 110 of the first substrate 101 is directly bonded with a flat surface of a second substrate or a silicon substrate 111 by holding these two substrates together, keeping the surfaces in close contact, under a protective atmosphere at a temperature of from 400° to 1100° C.

After bonding, the reverse side of the first substrate 101 is rough-ground or lapped until several tens of Ωm of the substrate 101 remains, and then mirror-polished by mechanical-chemical etching (selective etching) until the silicon oxide film 103 appears, i.e., the reference plane C1 shown in FIG. 22 appears. This subdivides an area of the silicon substrate 101 and forms semiconductor layers 112, 113, and 114 which are isolated from each other.

As shown in FIG. 20, a P channel MOS transistor 115, an N channel MOS transistor 116, and an NPN bipolar transistor 117 are formed in the following sequence. Namely, after forming a 300 to 800Å thick gate oxide film 118, a polysilicon gate 119 is formed of a phosphorous-doped polysilicon. The P region 120 of the P channel MOS transistor 115 and the P region 121 of the NPN bipolar transistor 117 are formed. The N source-drain region 122 of the N channel MOS transistor and the N region 123 of the NPN bipolar transistor are formed. An interlayer film 124 and electrode layers 125 of the polysilicon film 108, including an electrode 125a, are formed. A predetermined voltage is applied to the electrode layer 125a electrically connected to the doped polysilicon film 108.

The numeral 126 in FIG. 20 denotes an N$^+$ diffused region formed by thermal diffusion in the doped polysilicon film 108.

The above described process is summarized as follows.

A concave-convex region defined by the concavities 102a, 102b, and 102c is formed on the principal surface of the silicon substrate 101 or a first semiconductor substrate, the silicon oxide film 103 or a mask is formed on the principal substrate, the silicon oxide film 103 or a mask is formed on the principal surface of the silicon substrate 101 except for a predetermined region in the bottom of the concavity 102b, and the selective epitaxial layer having a predetermined thickness is formed by a selective epitaxy on the exposed portion or the portion at which the silicon oxide film 103 is not formed. These process steps provide semiconductor layers 112, 113, and 114 protruding from the reference plane C1 by different heights on the principal surface of the silicon substrate 101. The silicon oxide film 109 or an insulating film is then formed on the principal surface of the silicon substrate 101 including the semiconductor layers 112, 113, and 114. The principal surface of the silicon substrate 101 is bonded with the silicon substrate 111 or a second semiconductor substrate. The silicon substrate 101 is removed in the portion from the reverse side surface to the reference plane C1 to expose the semiconductor layers 112, 113, and 114 having a flat surface. Electrical elements are then formed on the semiconductor layers 112 and 114 in the concave-convex region of the silicon substrate 101 and on the semiconductor layer 113 formed by a selective epitaxy.

In the thus produced semiconductor device, the first semiconductor layers 112 and 114, in which the P channel MOS transistor and the NPN bipolar transistor are formed, and the second semiconductor layer 113, in which the N channel MOS transistor is formed, are isolated from each other on the silicon substrate 111 by the silicon oxide layers 103 and 109 or insulating layers and have a flat surface. Moreover, the semiconductor layers 112, 113, and 114 have surfaces which are even on the same plane. The first semiconductor layers 112 and 114 have a thickness t1 different from thickness t2 of the second semiconductor layer 113.

Consequently, in the semiconductor layers 112, 113, and 114 having different thicknesses and isolated from each other by the silicon oxide films or insulating films 103 and 109, semiconductor elements can be formed in accordance with these different thicknesses. This means that, for example, a high voltage transistor is formed in a thicker region and a high speed transistor is formed in a thinner region. A high precision integration of electrical elements can also be achieved by the fact that the semiconductor layers 112, 113, and 114 have a flat surface and the surface of these layers are even on the same plane.

Figure 27:
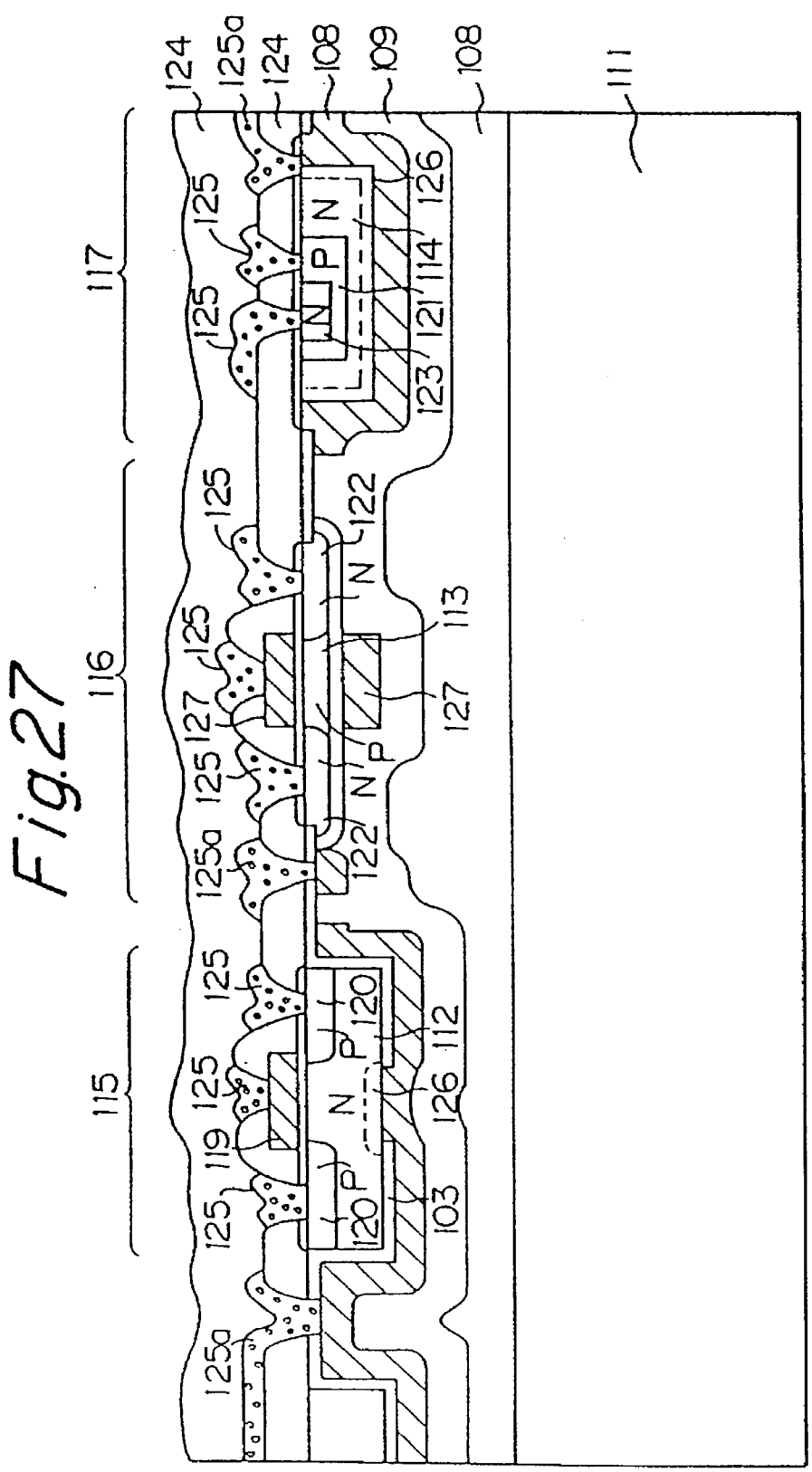

FIG. 27 shows a modification in which gate members 127 are formed above and below the SOI region or the semiconductor layer 113 of the N channel MOS transistor 116. The gate members are utilized as a gate for enhancing the current driving ability.

Figure 26:
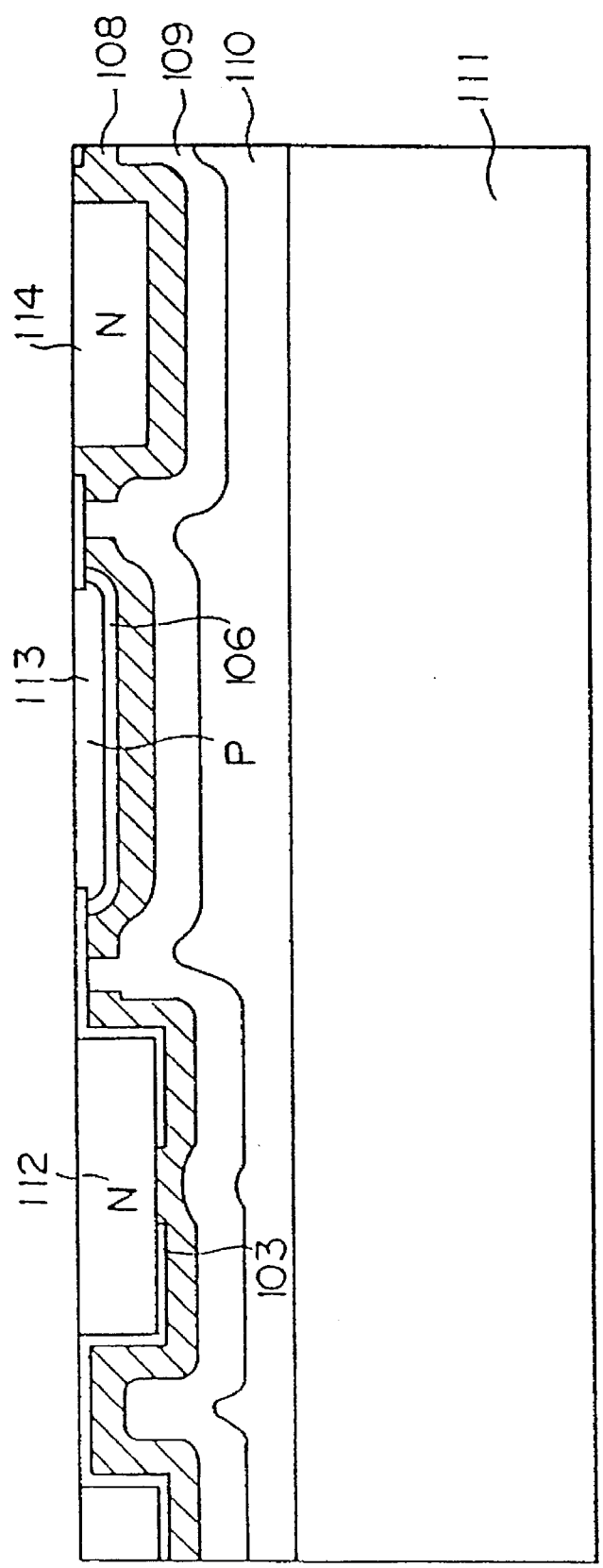
Figure 28:
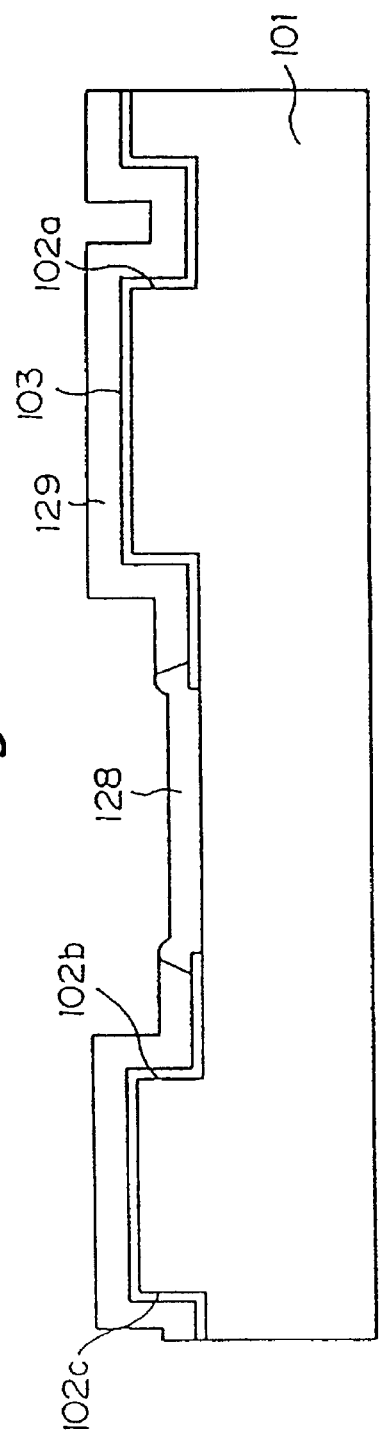
Figure 29:
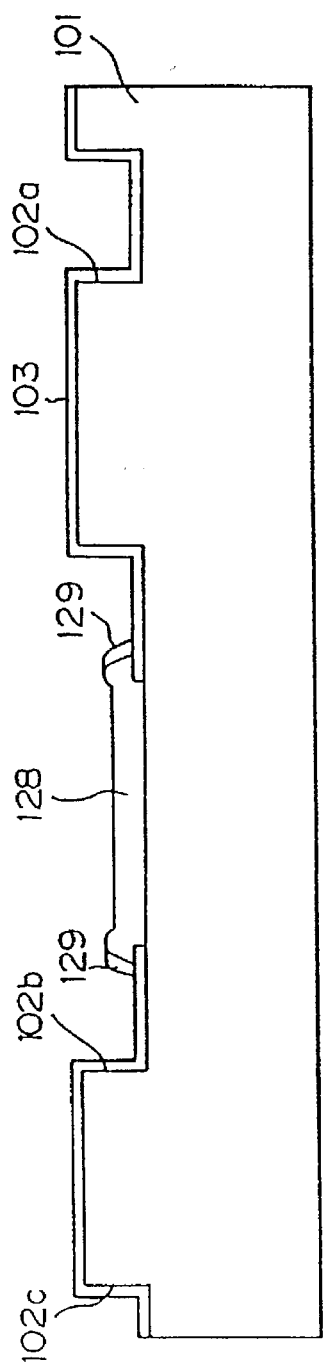

FIGS. 28 and 29 show another modification in which instead of forming the selective epitaxial layer 105 formed by a selective epitaxy in the removed portion 104, an epitaxial layer 128 is formed by a usual or non-selective epitaxy in the removed portion 104 and a polysilicon film 129 is also formed on the silicon oxide film 103 as shown in FIG. 28 and. As shown in FIG. 29, the polysilicon film 129 is removed by photoetching so that the epitaxial layer 128 remains at least at the position above the removed portion 104, followed by the same process steps as shown in FIGS. 24 through 26 to produce a semiconductor device.

Figure 30A:
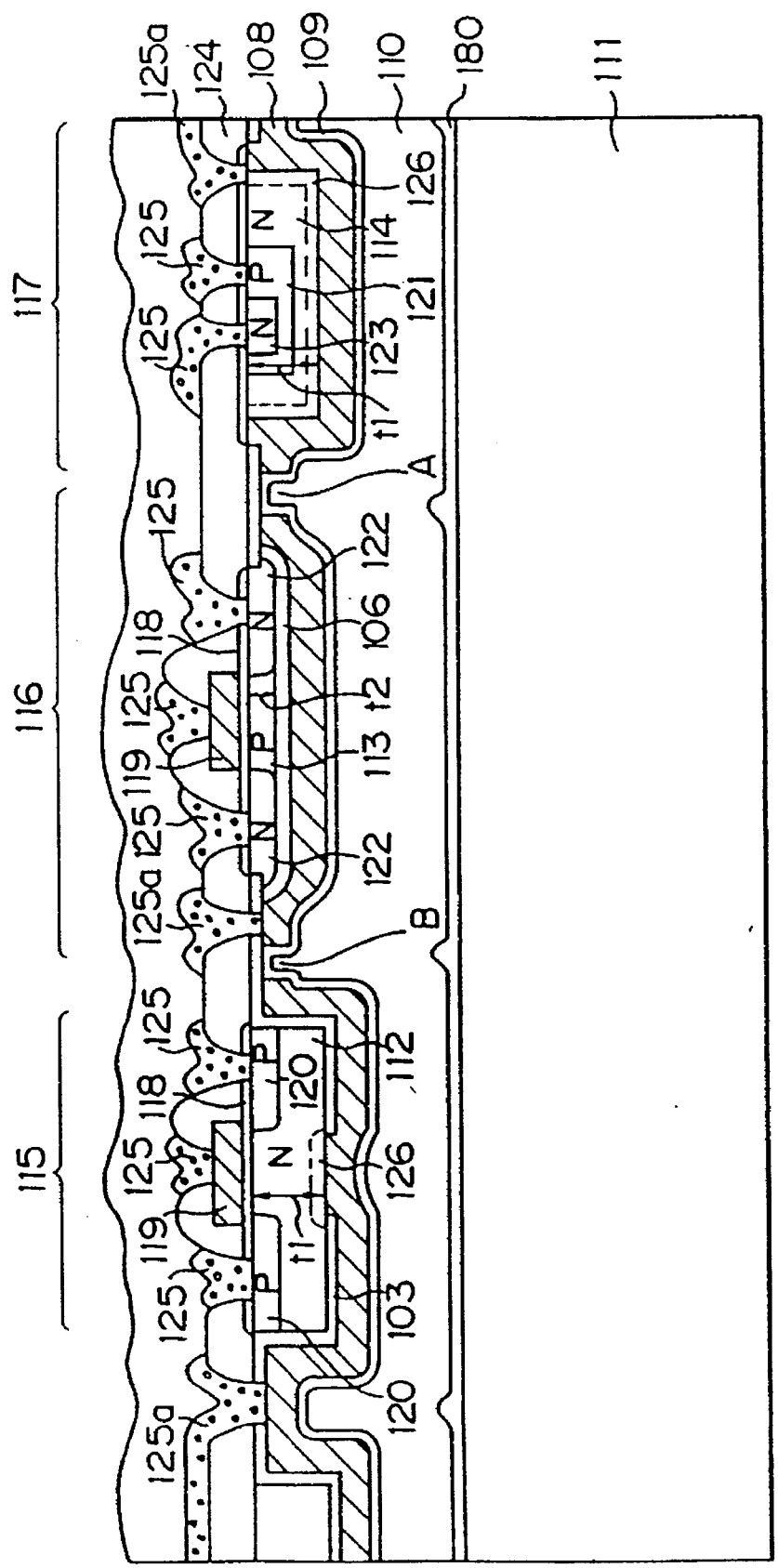
FIG. 30A is a sectional view showing another modification of FIG. 20.

FIG. 30A shows a further modification of the arrangement shown in FIG. 20 in which a thinner silicon oxide layer 109 is formed so that a polysilicon film 110 can also be formed inside the portions "A" and "B". In this case, these portions "A" and "B" may be utilized as a layer effecting an electrical shield between elements to properly stabilize the device further. To effect a substrate side fixing of the shield voltage, the polysilicon film 110 is doped with phosphorus, arsenic, or the like when an N type silicon substrate 111 is used and, when a P type silicon substrate is used, the polysilicon film 110 is doped with boron. Layer 180 separates silicon film layer 110 from substrate layer 111, to insulate and separate the two layers.

Figure 30B:
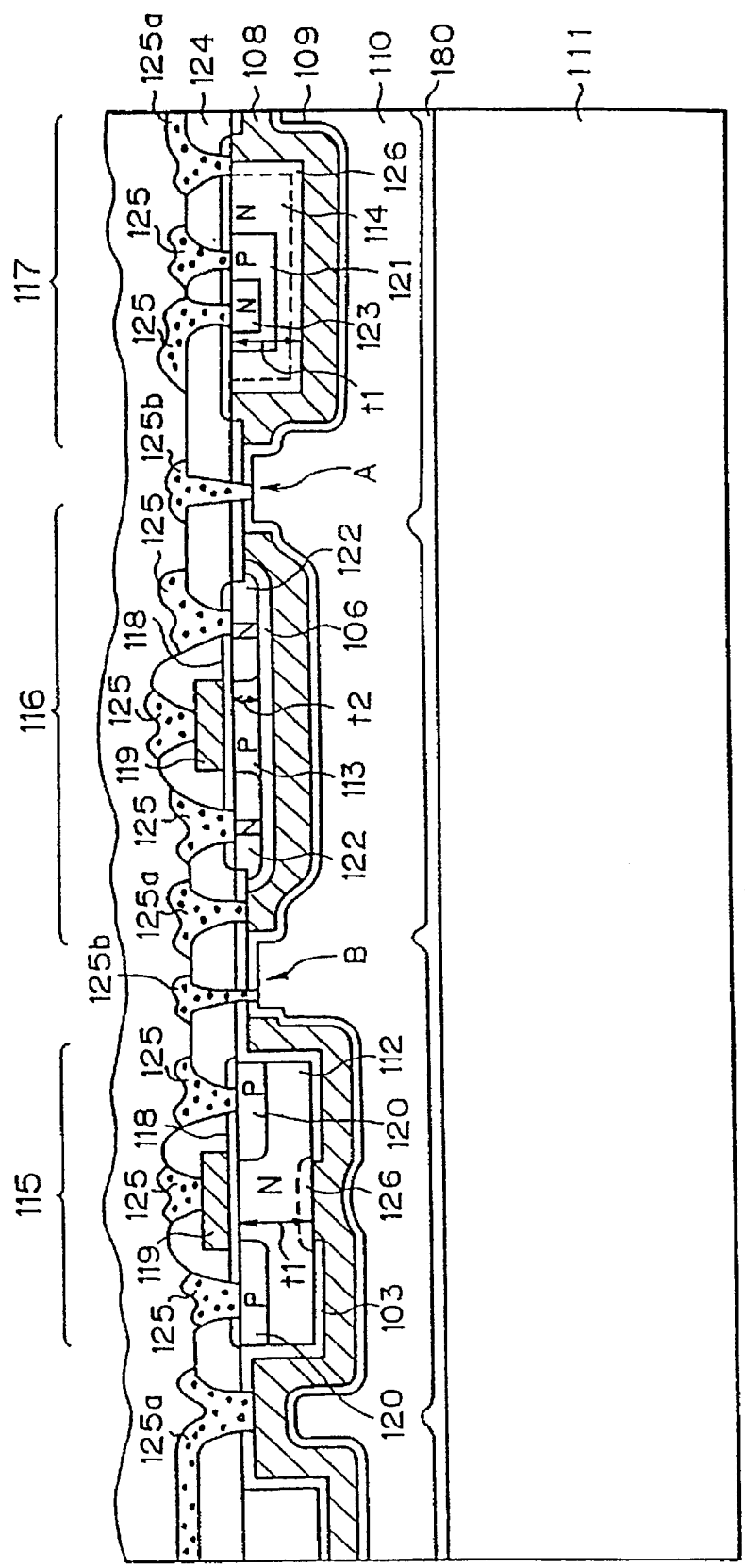
FIG. 30B shows a modification of FIG. 30A.

FIG. 30B shows an improvement whereby the substrate side fixing of the shield voltage can be effected. FIG. 30B uses a later formation of an Al conductor layer 125b, if contact holes extending from the surface are formed in the portions "A" and "B" during a usual process step of forming contact holes.

Example 4

Figure 33:
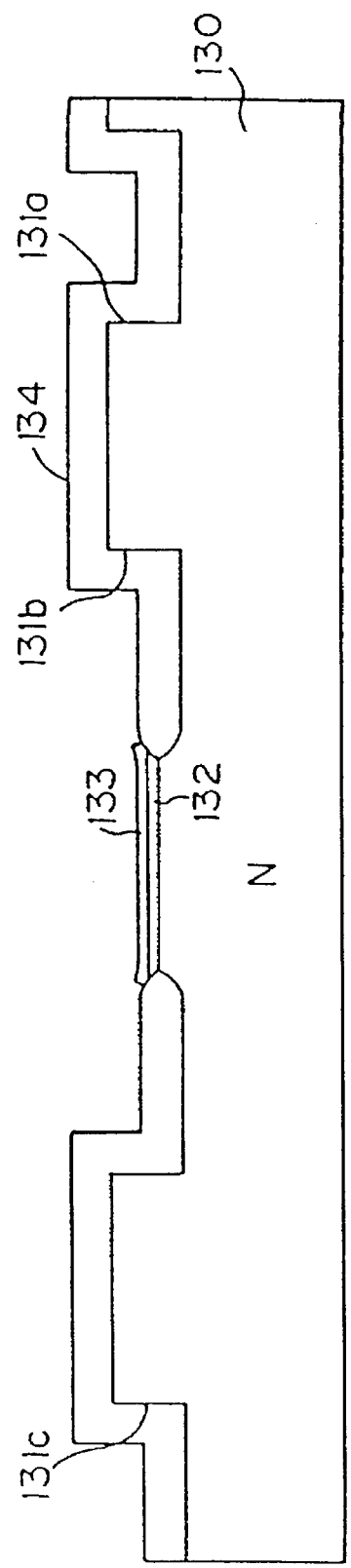

As shown in FIG. 31, concavities 131a, 131b, and 131c are formed in a predetermined region of the principal surface of an N type (100) silicon substrate of 1 to 50 Ω-cm or a first semiconductor substrate 130. Subsequently, a silicon oxide film 132 is formed by thermally oxidizing the entire principal surface of the silicon substrate 130, and then a silicon nitride film (Si$_3$N$_4$) 133 is formed by an LPCVD process. As shown in FIG. 32, the silicon oxide film 132 and the silicon nitride film 133 are removed in the regions other than a predetermined region of the bottom of the concavity 131b. As shown in FIG. 33, a silicon oxide film or a field oxide film 134 is formed in the region in which the silicon nitride film does not remain by thermal oxidation under an oxygen atmosphere, effecting a LOCOS process.

Figure 34:
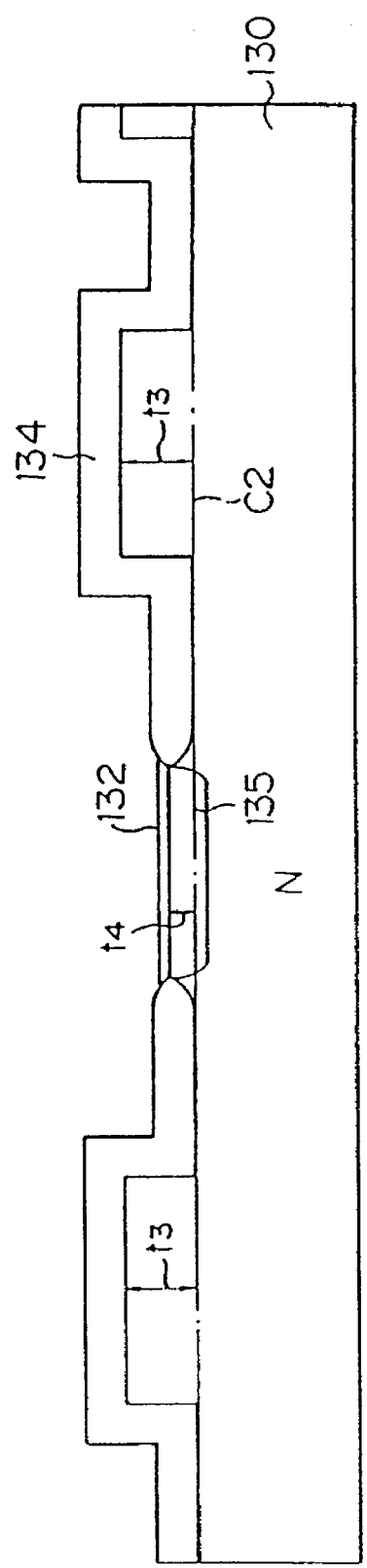

Next, as shown in FIG. 34, the nitride film 133 is removed with a hot phosphoric acid, a boron ion implantation is carried out at a predetermined dosage by using the silicon oxide film 134 as a mask to form a boron-implanted region 135, and heat treatment is carried out to activate the ion-implanted region 135 and effect the diffusion of boron to form a P type layer. It is also possible to not remove the nitride film 133 before the ion implantation for forming the P type layer.

This provides semiconductor layers protruding from the principal surface to predetermined heights or thicknesses of t3 and t4 with respect to a reference plane C2 corresponding to the substrate 130 surface in contact with the lowest surface of the silicon oxide film 134.

The silicon oxide films 132 and 134 are removed as shown in FIG. 35 and a new silicon oxide film or an insulating film 136 having a predetermined thickness is then formed on the principal surface of the silicon substrate 130 as shown in FIG. 36. It is also possible that the silicon nitride film 133 and the silicon oxide films 132 and 134 are not removed and are utilized for further process steps.

Figure 37:
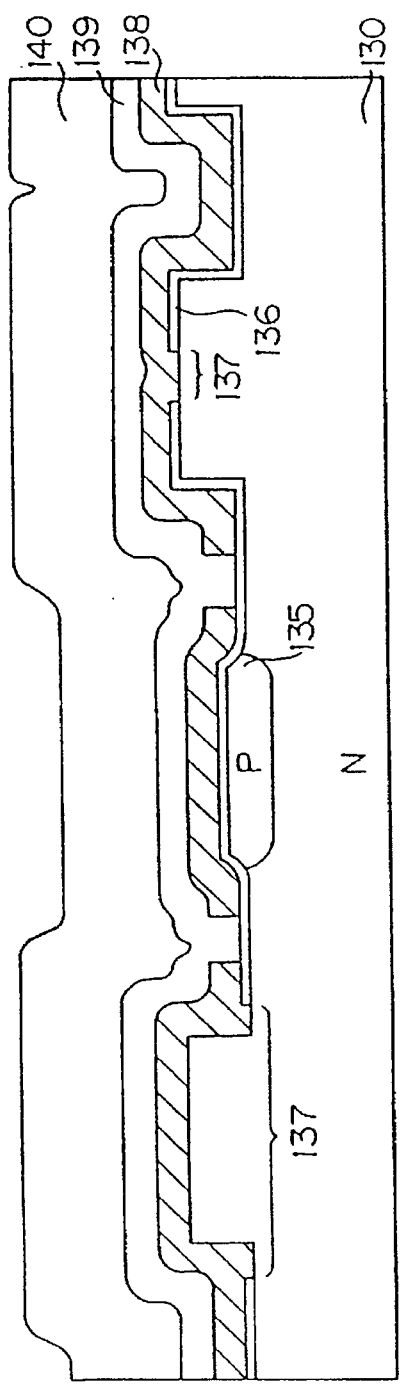

As shown in FIG. 37, the silicon oxide film 136 is partially removed to form a substrate contact portion 37. An arsenic-doped polysilicon film 138 is then formed on the silicon oxide film 136 by LPCVD or the like. The doped polysilicon film 138 is patterned by removing the predetermined regions thereof by dry etching, etc. Subsequently, a silicon oxide film or an insulating film 138 is formed on the doped polysilicon film 138 by CVD and another polysilicon film 140 is formed on the silicon oxide film 139.

Figure 38:
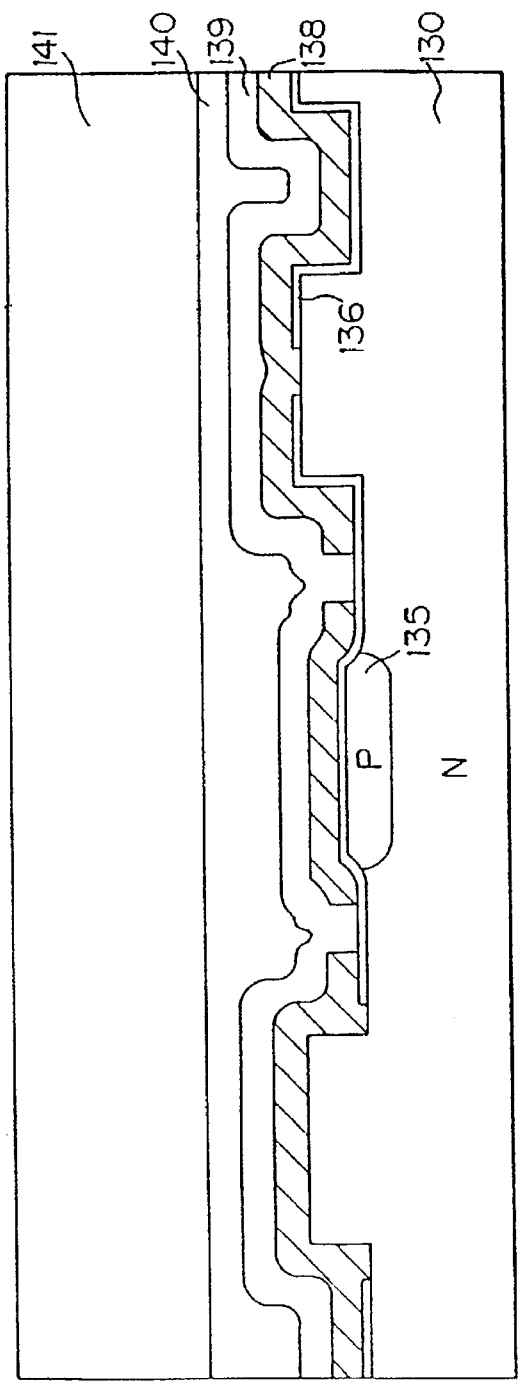

Next, as shown in FIG. 38, the surface of the polysilicon film 140 is flattened by mirror-polishing, etching, etc. The thus flattened surface of the polysilicon film 140 is then directly bonded to a flattened surface of another silicon substrate or a second substrate 141 by holding them in close contact with each other at a temperature of from 400° to 1100° C. under a protective atmosphere.

Figure 39:
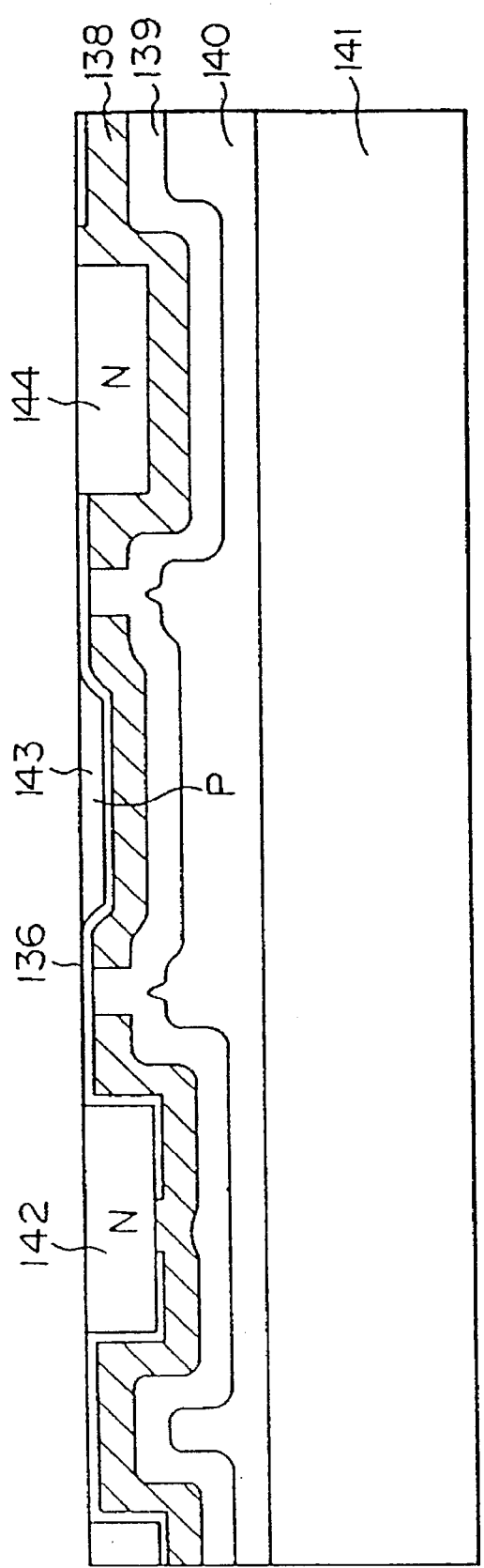

As shown in FIG. 39, the reverse side of the silicon substrate 141 is rough-ground or lapped to a thickness of several tens of Ωm and mirror-polished by mechanical-chemical etching (or selective polishing) until the silicon oxide film 136 is exposed, i.e., the silicon substrate 130 is removed until the reference plane shown in FIG. 34 appears. Thus, semiconductor layers 142, 143, and 144 are formed in such a way that portions of the silicon substrate 130 are isolated from each other.

Figure 40:
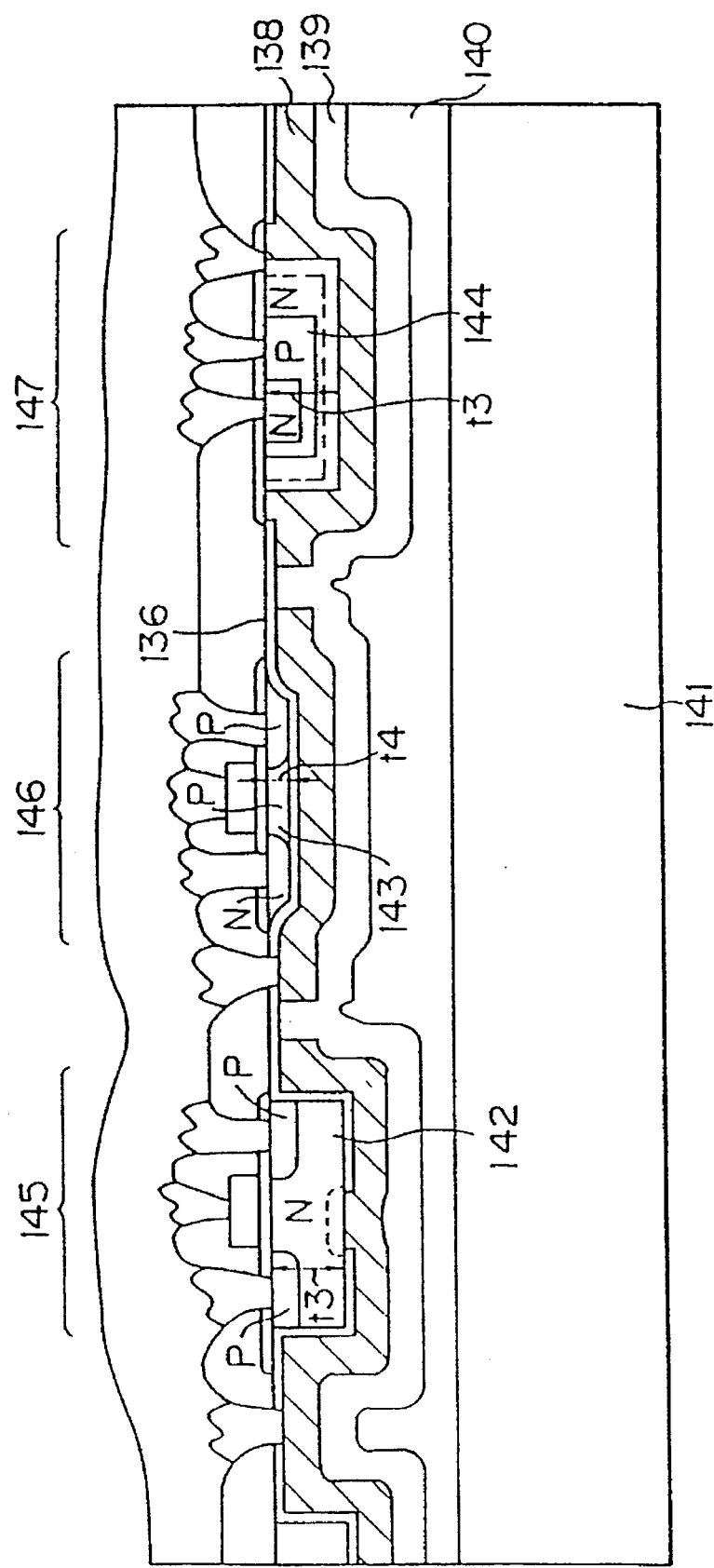

FIG. 40 shows the subsequent steps of forming a P channel MOS transistor 145, an N channel MOS transistor 146, and an NPN bipolar transistor 147. These steps are the same as those previously described in Example 3.

To summarize the above-described process steps, a concave-convex portion defined by the concavities 131a, 131b, and 131 and having a predetermined depth is formed on the silicon substrate 130 or a first semiconductor substrate and the silicon oxide film 134 or a field oxide film is formed on the principal surface of the silicon substrate 130 by a LOCOS process during which a predetermined region in the bottom of the concavity 131b is masked. This provides a plurality of semiconductor layers 142, 143, and 144, the principal surface of the silicon substrate 130 is bonded to the silicon substrate 141, and the portion of the silicon substrate 130 from the reverse side thereof to the reference plane C2 is removed to expose the semiconductor layers 142, 143, and 144, each having a flat surface. Then, elements are formed on the semiconductor layers 142 and 143 defined by the concave-convex region of the silicon substrate 130 and on the semiconductor layer 143 formed by LOCOS using a mask.

In the thus produced semiconductor device, the first semiconductor layers 142 and 144, in which a P channel MOS transistor 145 and an NPN bipolar transistor 147 are to be formed, and the second semiconductor layer 143, in which an N channel MOS transistor 146 is to be formed, are isolated by the silicon oxide film 136 on the silicon substrate 141 and have a flat surface. The surfaces of the semiconductor layers 142, 143, and 144 are also even on the same plane. The first semiconductor layers 142 and 144 have a thickness t3 different from the thickness t4 of the second semiconductor layer 143.

Consequently, in the semiconductor layers 142, 143, and 144 having different thicknesses and isolated from each other by the silicon oxide films or insulating films 136 and 139, semiconductor elements are disposed in accordance with these different thicknesses.

Figure 41:
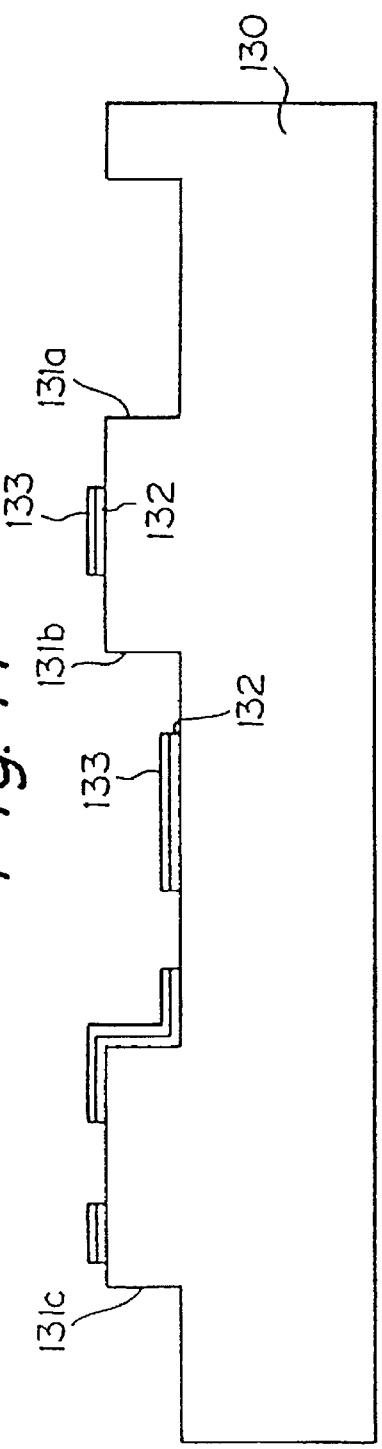
Figure 42:
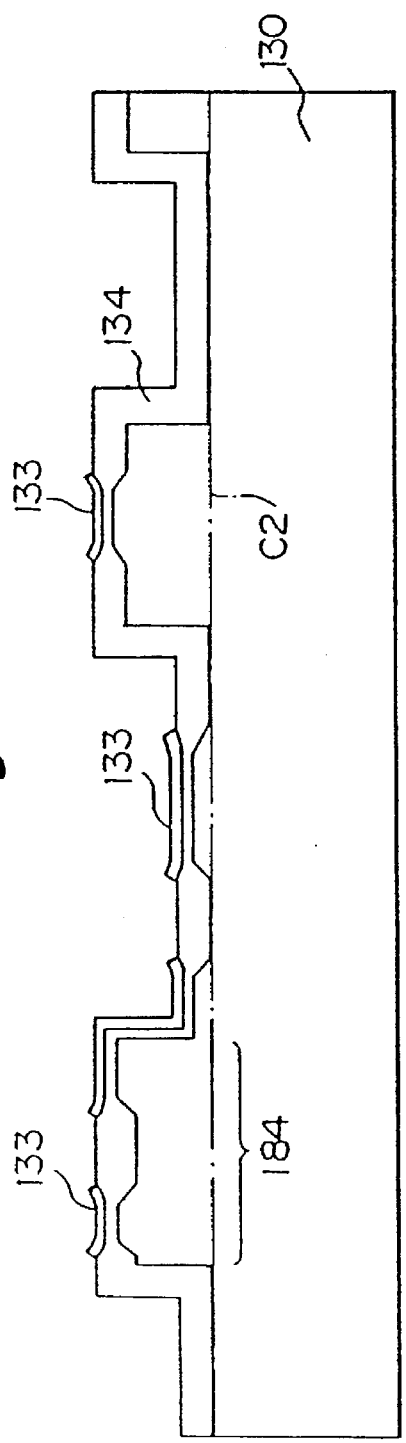

In a modification, the silicon nitride film 133 and the silicon oxide film 132 are retained in a predetermined region of the bottom in the concavity 131 formed in the silicon substrate 130 and in a predetermined region of the upper surface of the convexity as shown in FIG. 41 and, as shown in FIG. 42, a LOCOS process is carried out, to obtain different thicknesses of the SOI layer in a region in which an SOI element is to be formed, for example, a region in which a transistor is to be formed. This allows, for example, the formation of a high voltage and high speed MOS transistor in the region in FIG. 42.

Example 5

Figure 43:
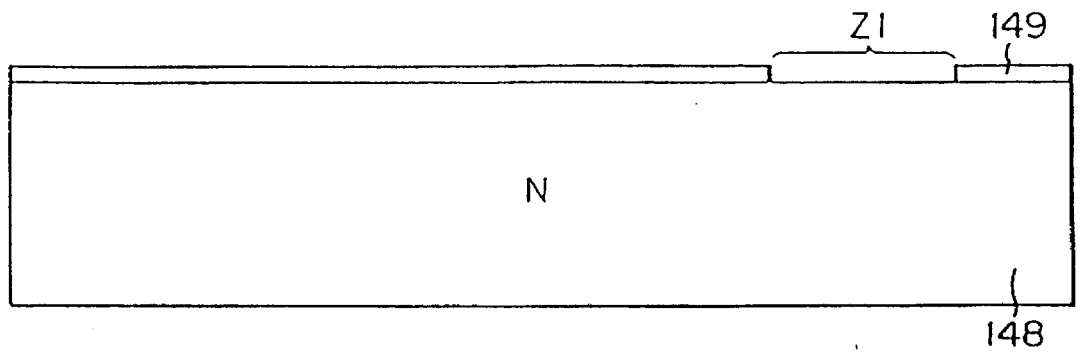
Figure 44:
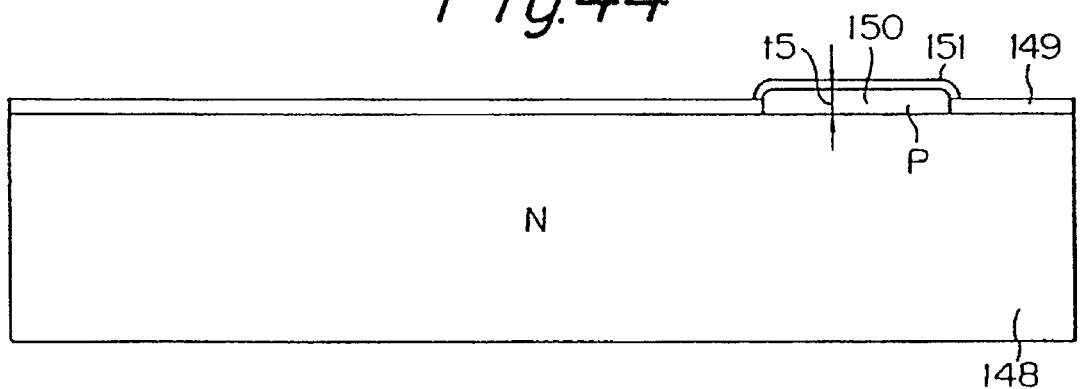

As shown in FIG. 43, a silicon oxide film 149 or a masking and insulating film is formed by thermal oxidation on an N type (100) silicon substrate of 101 to 50 Ω-cm or a first semiconductor substrate 148. The silicon oxide film 149 is then removed in a predetermined region (the first region Z1) and a P type selective epitaxial layer 150 or a semiconductor layer is then formed by selective epitaxy, as shown in FIG. 44. The selective epitaxial layer 150 has a thickness of t5. A silicon oxide film or a masking and insulating film 151 is formed on the selective epitaxial layer 150 by thermal oxidation or CVD.

Figure 45:
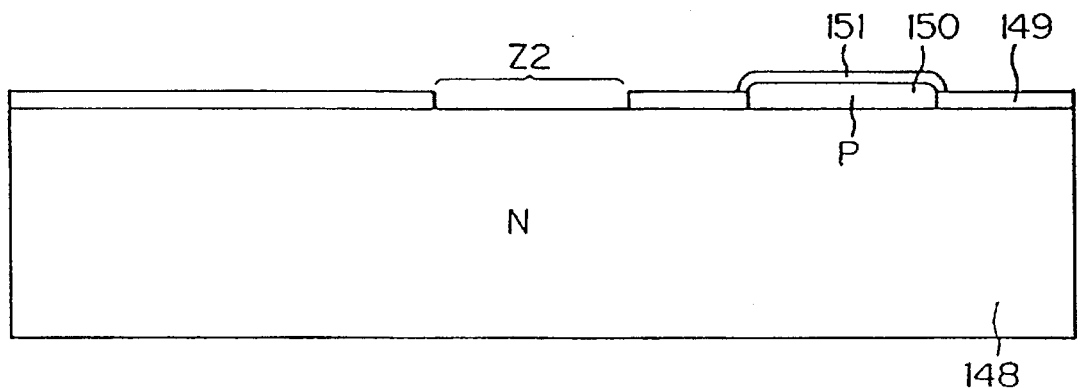
Figure 46:
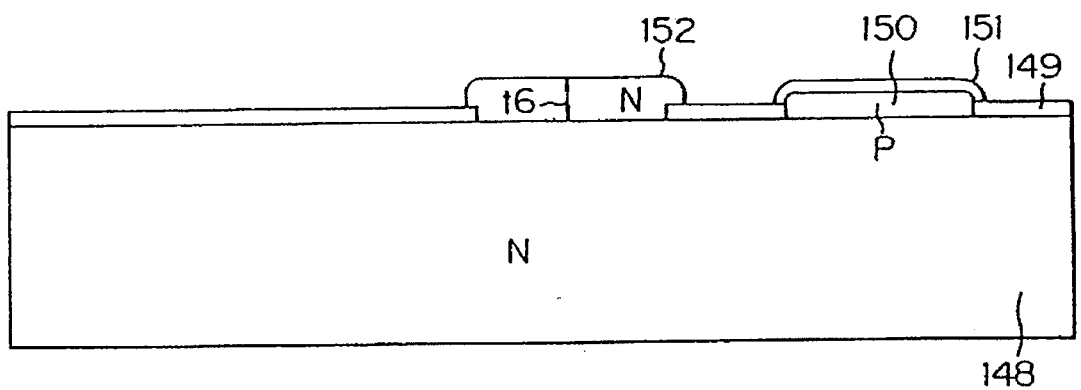
Figure 47:
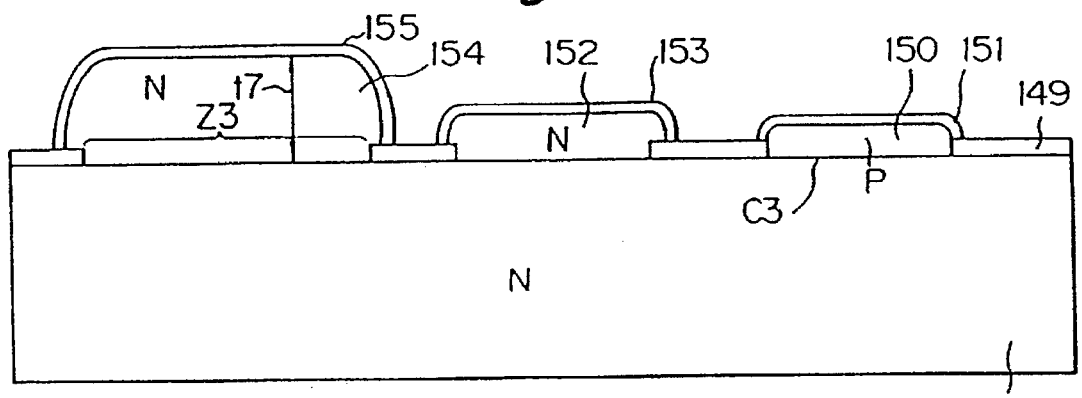

Subsequently, as shown in FIG. 45, the silicon oxide film 149 is removed in a predetermined region (the second region Z2). As shown in FIG. 46, an N type selective layer or a semiconductor layer 152 having a thickness of t6 (>t5) is formed by selective epitaxy. As shown in FIG. 47, a silicon oxide film 153 as a masking and insulating film is formed on the selective epitaxial layer 152 by thermal oxidation or CVD. The silicon oxide film 149 is removed in a predetermined region (the third region Z3) and an N type selective epitaxial layer 154 having a thickness of t7 (>t6) is then formed by selective epitaxy. This provides semiconductor layers protruding from the principal surface of the silicon substrate 148 by heights t5, t6, and t7 with respect to the reference plane C3.

A silicon oxide film 155 is formed on the selective epitaxial layer 154 by thermal oxidation or CVD.

Figure 48:
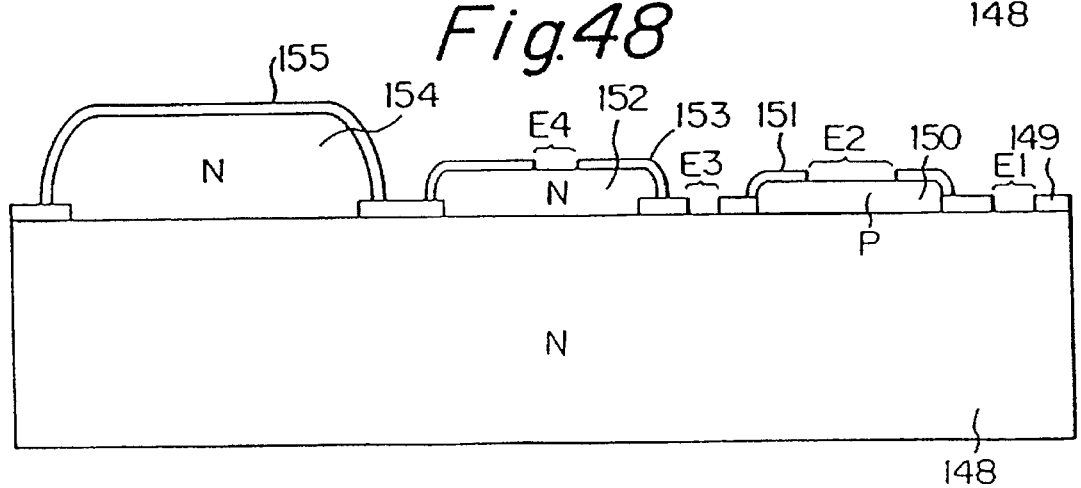
Figure 49:
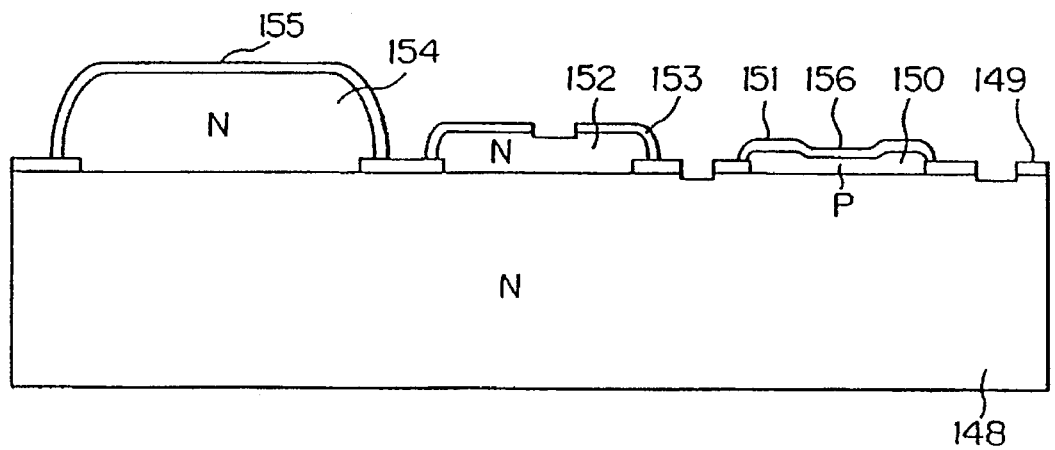

As shown in FIG. 48, the silicon oxide films 149, 151, and 153 are partially removed in regions E1 to E4. As shown in FIG. 49, a silicon oxide film 156 having a smaller thickness than the surrounding portion is formed only on the selective epitaxial layer 150. In this case, after removing the silicon oxide films in the four regions E1 to E4, thin oxide films are formed in these regions, the region E2 is then masked, and the silicon oxide films are removed only in the regions E1, E3, and E4. It is also possible that the silicon oxide film 151 is removed only in the region E2, a thin oxide film is formed in this region, the regions other than the regions E1, E3, and E4 are masked, and the silicon oxide films are removed in the regions E1, E3, and E4.

Figure 50:
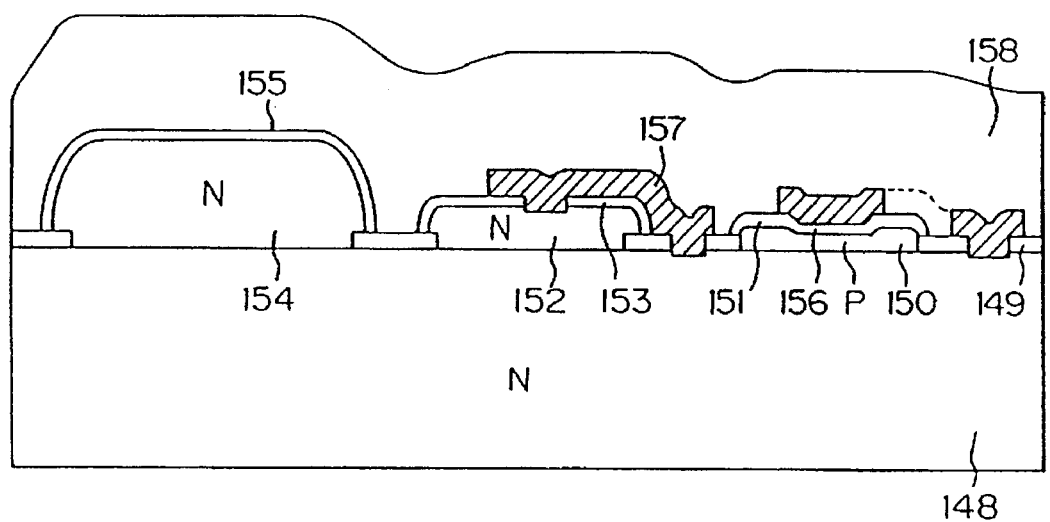
Figure 51:
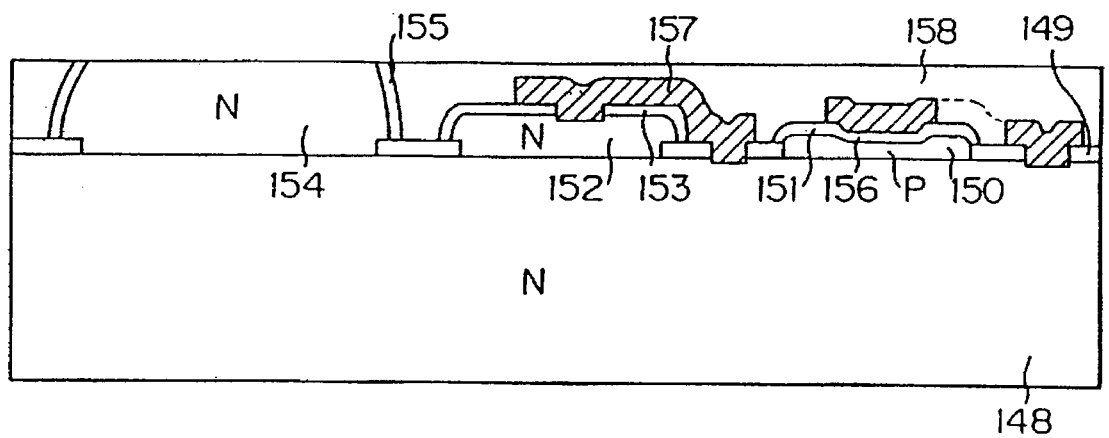

As shown in FIG. 50, an arsenic-doped polysilicon film 157 is formed on the silicon substrate 148 by LPCVD (low-pressure chemical vapor deposition), the doped polysilicon film 157 is then patterned by removing predetermined regions thereof by dry etching, etc., a silicon oxide film 158 is formed on the silicon substrate 148 by CVD, and the surface of the silicon oxide film 158 is then flattened by mirror-polishing, etc., as shown in FIG. 51. This polishing is carried out until the selective epitaxial layer 154 is exposed.

Figure 52:
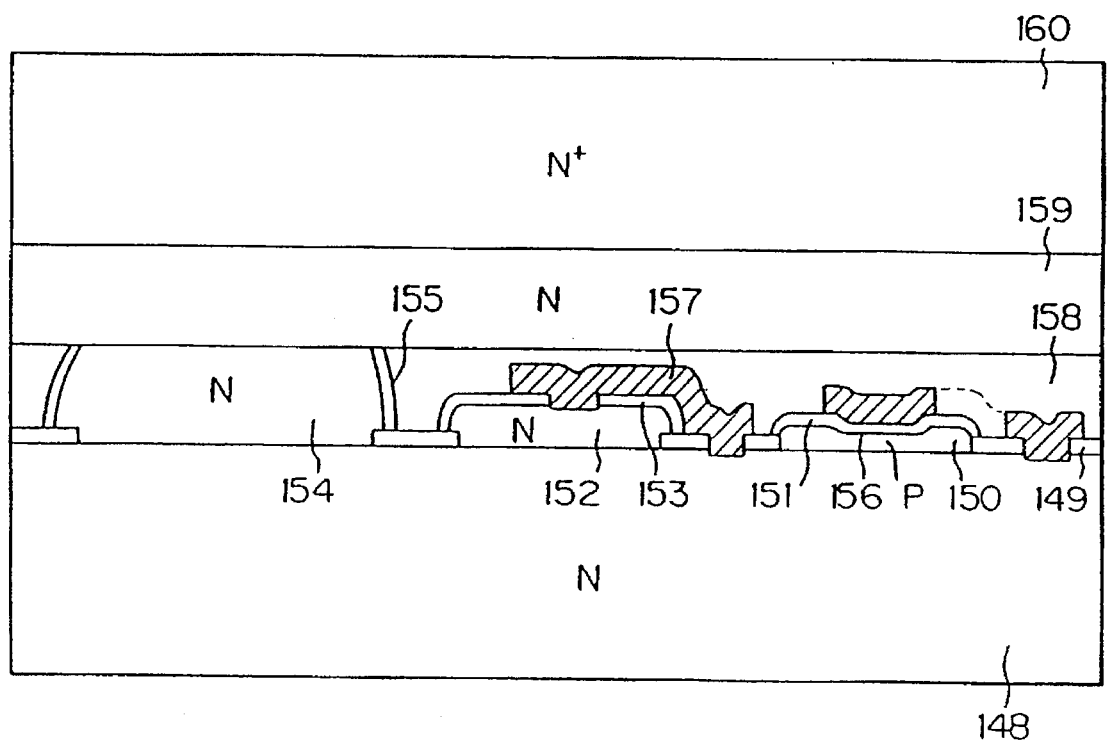

In FIG. 52, a second silicon substrate is prepared by forming an N type epitaxial layer 159 on an N type silicon substrate 160 and by flattening the surface of the epitaxial layer 159, which is then bonded to the flattened silicon substrate 148 by holding the former and the latter substrates in close contact at a temperature of from 400° C. to 1100° C. under a protective atmosphere.

In a modification, an N type epitaxial layer is formed on the exposed selective epitaxial layer 154 shown in FIG. 51 and, simultaneously, a polysilicon film is formed on the silicon oxide film or an insulating film 158. The surfaces of the layers 154 and the layer 158 are then flattened for direct bonding to the second substrate.

Figure 53:
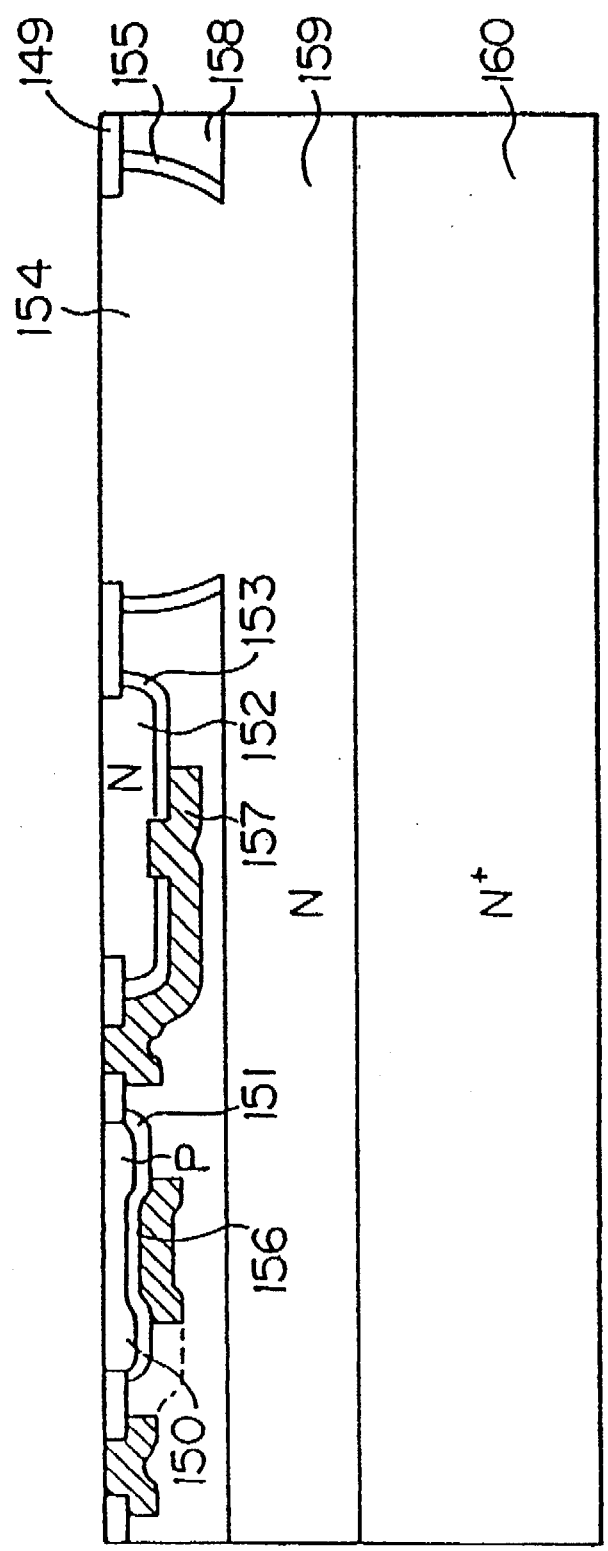

Next, as shown in FIG. 53, the reverse side of the silicon substrate 148 is rough-ground or lapped until the substrate thickness becomes as small as several tens of Ωm and is then mirror-polished by mechanical-chemical etching (selective etching) until the silicon oxide film 149 is exposed, i.e., the silicon substrate 148 is removed until the reference plane C3 shown in FIG. 47 appears. The selective epitaxial layers 50, 52, and 54 are thus isolated from each other.

Figure 54:
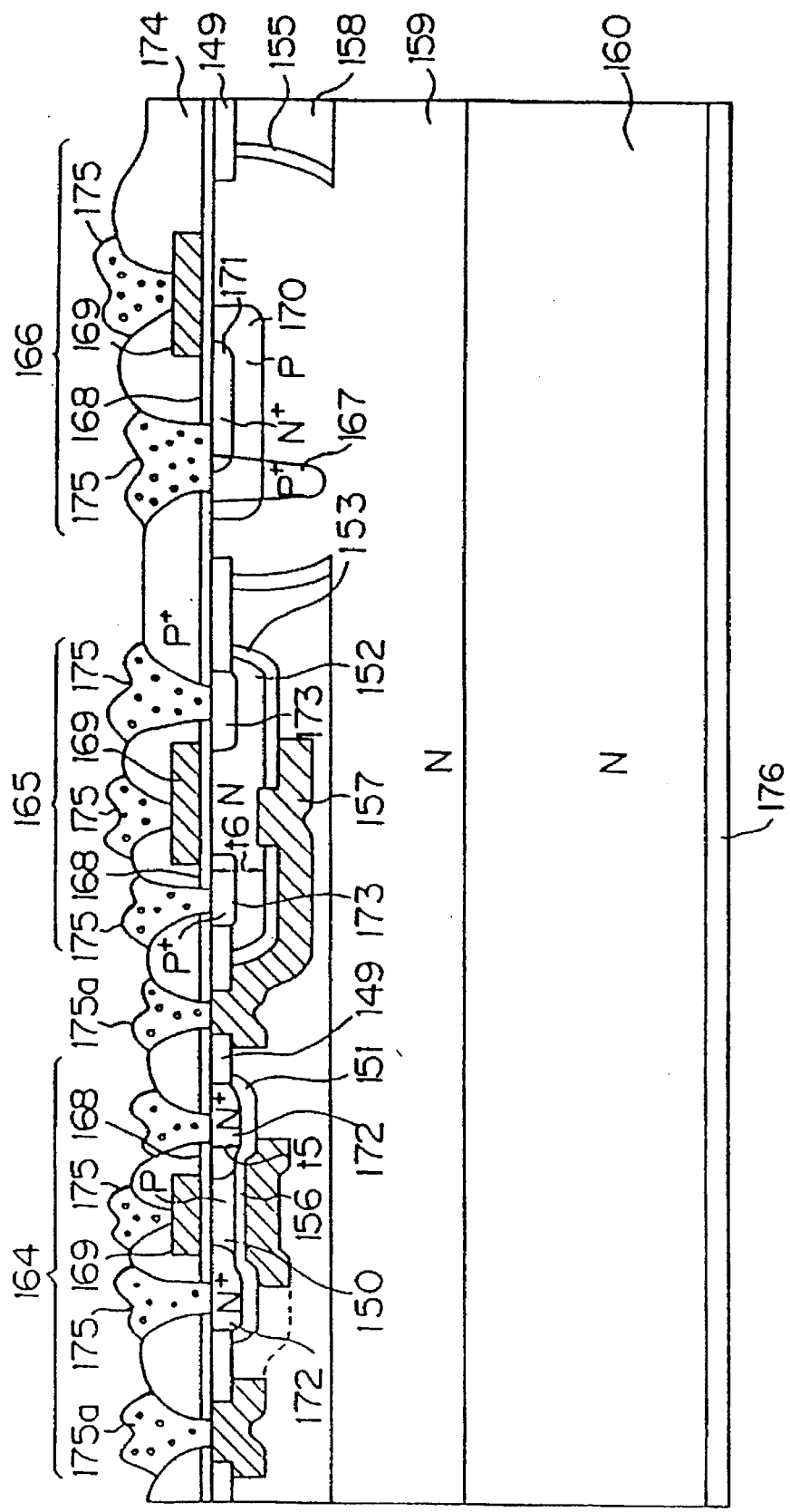

Then, as shown in FIG. 54, an N channel MOS transistor 164, a P channel MOS transistor 165, and an N channel power MOS transistor 166 are formed. The P⁺ region 167 of the N channel power MOS transistor 166 is formed by boron ion implantation. After forming a 300 to 800Å thick gate oxide layer 168, a polysilicon gate 169 is formed of a phosphorous-doped polysilicon. Subsequently, the P region 170 and the N⁺ region 171 of the N channel power MOS transistor 166 are formed. The N⁺ source-drain region 172 of the N channel MOS transistor 164 is formed and the P⁺ source-drain region 173 of the P channel MOS transistor 165 is formed. Thereafter, an interlayer film 174, electrode layers 175 including an electrode layer 175a of the doped polysilicon film 157, and a reverse side electrode or drain electrode 176 of the N channel power MOS transistor 166 are formed. A predetermined voltage is applied to the electrode layer 175a electrically connected to the doped polysilicon film 157. In the N channel MOS transistor 164, the oxide film of the gate portion embedded in the wafer has a smaller thickness in the channel region (the silicon oxide film 156) than in other regions, to reduce the capacity.

To summarize the above-described process, a silicon oxide film 149 or a mask is formed on the principal surface of the silicon substrate 148 or a first semiconductor substrate except for the first region Z1, a selective epitaxial layer 150 (semiconductor layer) having a predetermined thickness is formed on the exposed portion in the first region Z1 of the silicon substrate 148, silicon oxide films 149 and 151 or masks are formed on the principal surface of the silicon substrate 148 except for the second region Z2, and a selective epitaxial layer (semiconductor layer) IS2 having a predetermined thickness is formed by selective epitaxy on the exposed portion of the silicon substrate 148 in the second region Z2. This provides a plurality of semiconductor layers 50 and 52 protruding from the principal surface of the silicon substrate 148 at different heights with respect to the reference plane C3. The silicon oxide film (insulating film) 153 is then formed on the principal surface of the silicon substrate 148 including the semiconductor layers 50 and 52. The principal surface of the silicon substrate 148 (a first semiconductor substrate) and the silicon substrate 160 (a second semiconductor substrate) are bonded. The silicon substrate is removed in the portion from the reverse side thereof to the reference plane C3, to expose the semiconductor layers 150 and 152 -having a flat surface. Electrical elements are then formed in the selective epitaxial layers 150 and 152 (semiconductor layers).

In the thus produced semiconductor device, the selective epitaxial layer 150 or a first semiconductor layer, in which an N channel MOS transistor 164 is to be formed, and the selective epitaxial layer 152 or a second semiconductor layer, in which a P channel MOS transistor 165 is to be formed, have a flat surface and are isolated by the silicon oxide films 149, 151, and 153 (insulating films) on the silicon substrate 160. The surface of the selective epitaxial layers 150 and 152 are even. The selective epitaxial layers 150 and 152 have different thicknesses t5 and t6, respectively. Thus, the selective epitaxial layers 150 and 152 are isolated from each other by the silicon oxide films 149, 151, and 153 (insulating films) and have different thicknesses t5 and t6, so that electrical elements can be disposed in these layers 150 and 152 in accordance with the different thicknesses t5 and t6. This is also the case for the N channel power MOS transistor 166.

In a modification, a silicon oxide film 149 having first and second regions Z1 and Z2 or openings on the silicon substrate 148, and epitaxial layers having the same thickness are formed by epitaxy in the first and the second regions Z1 and Z2. The epitaxy is allowed to continue masking the first region Z1 so that only the epitaxial layer of the second region Z2 grows to a greater thickness.

As herein described, the present invention provides a semiconductor device and a process for producing same, in which electrical elements are protected against external disturbance and have a flat surface. The present invention enables a high precision integration of different electrical elements having different thicknesses.

What is claimed is:

1. A semiconductor device comprising:

a semiconductor substrate;

a semiconductor layer disposed on said semiconductor substrate;

a first element formed in a first region of said semiconductor layer, an outer surface of said first element including side walls and a bottom;

a second element formed in a second region of said semiconductor layer, an outer surface of said second element including side walls and a bottom; and first and second insulating layers surrounding said outer surface of said first element and said second element respectively, to electrically insulate and separate said first element from said second element and from said semiconductor substrate;

a first electrical shield layer disposed between said first insulating layer and said first element, said first electrical shield layer surrounding said outer surface of said first element, said first electrical shield layer being biasable to a first reference electric potential applied thereto, said first electrical shield layer shielding said first element from an electrical fluctuation of said semiconductor substrate caused by an element other than said first element;

a second electrical shield layer disposed between said second insulating layer and said second element, said second electrical shield layer being biasable to a second reference electric potential applied thereto;

a first electrode connection portion of said first electrical shield layer formed by an enlarged portion of said first electrical shield layer;

a second electrode connection portion of said second electrical shield layer formed by an enlarged portion of said second electrical shield layer;

a first electrode, connected to said first electrode connection portion of said first electrical shield layer, for receiving and applying said first reference electric potential to said first electrical shield layer; and a second electrode, connected to said second electrode connection portion of said second electrical shield layer, for receiving and applying said second reference electric potential to said second electrical shield layer;

whereby said first electrical shield layer and said second electrical shield layer are capable of being biased simultaneously at different reference electric potentials.

2. A semiconductor device according to claim 1, wherein:

at least one of said first element and said second element is a P-channel MOS transistor; and said semiconductor device further comprises power supply potential means for maintaining at least one of said first electrical shield layer and said second electrical shield layer at a power supply potential higher than a ground potential.

3. A semiconductor device according to claim 1, wherein:

at least one of said first element and said second element is an N-channel MOS transistor; and said semiconductor device further comprises ground potential means for maintaining at least one of said first electrical shield layer and said second electrical shield layer at a ground potential.

4. A semiconductor device according to claim 1, wherein:

said first element is a P-channel MOS transistor;

said second element is an N-channel MOS transistor; and said device further comprises:

power supply potential means for maintaining said first electrical shield layer of said first element at a power supply potential higher than a ground potential, and ground potential means for maintaining said second electrical shield layer of said second element at a ground potential.

* * * * *